US00RE47991E

(19) United States
(12) Reissued Patent
Tanaka

(10) Patent Number: US RE47,991 E
(45) Date of Reissued Patent: May 12, 2020

(54) ACOUSTIC WAVE ELEMENT AND ACOUSTIC WAVE DEVICE USING SAME

(71) Applicant: KYOCERA CORPORATION, Kyoto-shi, Kyoto (JP)

(72) Inventor: Hiroyuki Tanaka, Kyoto (JP)

(73) Assignee: KYOCERA CORPORATION, Kyoto (JP)

(21) Appl. No.: 15/954,867

(22) Filed: Apr. 17, 2018

Related U.S. Patent Documents

Reissue of:
(64) Patent No.: 9,319,023
Issued: Apr. 19, 2016
Appl. No.: 14/129,819
PCT Filed: Jun. 14, 2012
PCT No.: PCT/JP2012/065206
§ 371 (c)(1),
(2) Date: Dec. 27, 2013
PCT Pub. No.: WO2013/002033
PCT Pub. Date: Jan. 3, 2013

(30) Foreign Application Priority Data

Jun. 28, 2011 (JP) ..... 2011-143130
Mar. 14, 2012 (JP) ..... 2012-057594

(51) Int. Cl.
*H03H 9/145* (2006.01)
*H03H 9/25* (2006.01)
(Continued)

(52) U.S. Cl.
CPC ..... *H03H 9/25* (2013.01); *H03H 9/059* (2013.01); *H03H 9/1071* (2013.01);
(Continued)

(58) Field of Classification Search
CPC ..... H03H 9/25; H03H 9/14594; H03H 9/059; H03H 9/1452; H03H 9/1071; H01L 2224/16225; H01L 2924/181
(Continued)

(56) References Cited

U.S. PATENT DOCUMENTS 5,895,996 A 4/1999 Takagi et al.
6,346,761 B1 2/2002 Isobe et al. ..... H03H 9/02818 310/313 B
(Continued)

FOREIGN PATENT DOCUMENTS

JP S58-143620 A 8/1983
JP S63-184411 A 7/1988
(Continued)

OTHER PUBLICATIONS

International Search Report dated Sep. 18, 2012, issued for International Application No. PCT/JP2012/065206.
(Continued)

*Primary Examiner* — Kenneth Whittington
(74) *Attorney, Agent, or Firm* — Procopio Cory Hargreaves and Savitch LLP

(57) ABSTRACT

An IDT electrode of a SAW element has a plurality of first dummy electrodes which extend from the first bus bar to the second bus bar side and have tips which face the tips of the plurality of second electrode fingers through a plurality of first gaps, and a plurality of second dummy electrodes which extend from the second bus bar to the first bus bar side and have tips which face the tips of the plurality of first electrode fingers through a plurality of second gaps. The plurality of first gaps and the plurality of second gaps are arranged to be inclined to the same side relative to the propagation direction of SAW. When the inclination angles of the first gaps and the second gaps relative to the propagation direction are a first angle θA and a second angle θB, the following are true: 10°≤θA≤26°, and 10°≤θB≤26°.

24 Claims, 14 Drawing Sheets

(51) Int. Cl.
*H03H 9/05* (2006.01)
*H03H 9/10* (2006.01)

(52) U.S. Cl.
CPC ..... *H03H 9/1452* (2013.01); *H03H 9/14594* (2013.01); *H01L 2224/16225* (2013.01); *H01L 2924/181* (2013.01)

(58) Field of Classification Search
USPC ..... 310/313 A, 313 B, 313 C, 313 D, 313 R; 333/196, 195
See application file for complete search history.

(56) References Cited

U.S. PATENT DOCUMENTS 6,577,210 B1 * 6/2003 Tsutsumi ..... H03H 9/64 310/313 D
6,774,536 B2 * 8/2004 Kachi ..... H03H 9/02748 310/313 B
7,915,976 B2 * 3/2011 Tanaka ..... H03H 9/02574 310/313 C
2007/0296528 A1 12/2007 Kando
2009/0295507 A1 * 12/2009 Kando ..... H03H 9/0071 333/193
2010/0164646 A1 * 7/2010 Nakanishi ..... H03H 3/08 333/133
2010/0176900 A1 * 7/2010 Tanaka ..... H03H 9/02574 333/195
2010/0237963 A1 9/2010 Takamine ..... H03H 9/059 333/133

FOREIGN PATENT DOCUMENTS

JP H8-265088 A 10/1996
JP H08-265088 A 10/1996
JP 2000-286663 A 10/2000
JP 2000-286663 A 10/2002
JP 2002-314365 A 10/2002
JP 2008-035220 A 2/2008
JP 2009-219045 9/2009
JP 2009-219045 A 9/2009
JP 2011-097237 A 5/2011
WO 96/10293 A1 4/1996
WO 2006/109591 A1 10/2006
WO 2009-075088 A 6/2009
WO 2009/075088 A1 6/2009

OTHER PUBLICATIONS

Office Action dated Nov. 24, 2015, issued in counterpart Japanese Application No. 2013-522579.

* cited by examiner

ACOUSTIC WAVE ELEMENT AND ACOUSTIC WAVE DEVICE USING SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

TECHNICAL FIELD

The present invention relates to an acoustic wave element such as a surface acoustic wave (SAW) element and an acoustic wave device using the same.

BACKGROUND ART

Known in the art is an acoustic wave element having a piezoelectric substrate and an IDT (InterDigital Transducer) electrode (excitation electrode) provided on a major surface of the piezoelectric substrate. The IDT electrode has a pair of comb-shaped electrodes. Each comb-shaped electrode has for example a bus bar extending in the propagation direction of the acoustic wave and a plurality of electrode fingers extending from the bus bar in a direction perpendicular to the propagation direction of the acoustic wave. The pair of comb-shaped electrodes are arranged so that their plurality of electrode fingers mesh with each other (so that they intersect with each other). Further, there is also known an IDT electrode which further has dummy electrodes each extending from one of the bus bars to the other bus bar side, wherein the tips face the tips of the plurality of electrode fingers extending from the other bus bar through gaps.

Further, it is also known that a so-called transverse mode spurious wave sometimes occurs in the impedance characteristic in an acoustic wave element utilizing a quartz substrate, $LiNbO_3$ substrate, or the like as the piezoelectric substrate.

Patent Literature 1 discloses that a transverse mode spurious wave can be suppressed by obliquely inclining an intersection part (range where a plurality of electrode fingers of a pair of comb-shaped electrodes intersect with each other) relative to the propagation direction of the SAW in an IDT electrode having dummy electrodes.

Patent Literature 2 discloses that an IDT electrode having dummy electrodes wherein a transverse mode spurious wave can be suppressed by making mutually facing edge parts of two bus bars incline relative to the propagation direction. Further, in Patent Literature 2, a plurality of acoustic wave elements are experimentally produced by changing their inclination angles. The preferred inclination angles are regarded to be 18° to 72° based on the evaluation results. Further, Patent Literature 2 also disclose an IDT electrode in its FIG. 11 wherein the intersection part is formed obliquely relative to the propagation direction in the same way as Patent Literature 1.

When the intersection part is inclined relative to the propagation direction as in Patent Literature 1 and Patent Literature 2, the gaps between the tips of the plurality of electrode fingers and the tips of the dummy electrodes are arranged with a slant relative to the propagation direction of the acoustic wave as well, therefore the gaps end up entering into the range where the acoustic wave is originally going to propagate. Accordingly, the acoustic wave is apt to be scattered across the gaps, and consequently propagation loss is apt to occur. In both of Patent Literature 1 and Patent Literature 2, attention is paid to suppression of a spurious wave though no attention is paid to such propagation loss.

Further, in Patent Literature 2, nothing at all is mentioned about the shape of the intersection part (inclination angle of arrangement of the plurality of gaps) in trial manufacture and evaluation while changing the inclination angle of the edge part of the bus bar. Further, as deduced from a comparison of FIG. 3 and FIG. 5 in Patent Literature 2, in trial manufactures, the shape of the intersection part is a square as it is. That is, Patent Literature 2 shows no finding about the preferred range of numerical values for the inclination angle of the arrangement of the plurality of gaps.

Accordingly, provision of an acoustic wave element and acoustic wave device capable of suppressing propagation loss is desired.

CITATIONS LIST

Patent Literature

Patent Literature 1: Japanese Patent Publication No. 58-143620A

Patent Literature 2: Japanese Patent Publication No. 2000-286663A

SUMMARY OF INVENTION

An acoustic wave element of one aspect of the present invention has a piezoelectric substrate and an IDT electrode located on an upper surface of the piezoelectric substrate. The IDT electrode has a first bus bar and a second bus bar which face each other in a direction which intersects with the propagation direction of the acoustic wave, a plurality of first electrode fingers which extend from the first bus bar to the second bus bar side, a plurality of second electrode fingers which extend from the second bus bar to the first bus bar side and have a portion adjacent to the plurality of first electrode fingers in the propagation direction, a plurality of first dummy electrodes which extend from the first bus bar to the second bus bar side and have tips which face the tips of the plurality of second electrode fingers through a plurality of first gaps, and a plurality of second dummy electrodes which extend from the second bus bar to the first bus bar side and have tips which face the tips of the plurality of first electrode fingers through a plurality of second gaps. In a certain range of the propagation direction of the IDT electrode, when the arrangement direction of the first gaps among the plurality of first gaps which are adjacent to each other is the first direction, the first direction is inclined relative to the propagation direction, when the arrangement direction of the second gaps among the plurality of second gaps which are adjacent to each other is the second direction, the second direction is inclined to the side the same as the side to which the first direction is inclined relative to the propagation direction, and when the inclination angle of the first direction relative to the propagation direction is a first angle θA and the inclination angle of the second direction relative to the propagation direction is a second angle θB, the first angle θA and the second angle θB are within the following ranges.

$10° \leq \theta A \leq 26°$ $10° \leq \theta B \leq 26°$

An acoustic wave element of one aspect of the present invention has a piezoelectric substrate and an IDT electrode located on an upper surface of the piezoelectric substrate. The IDT electrode has a first bus bar and a second bus bar which face each other in a direction intersecting with the propagation direction of the acoustic wave, a plurality of first electrode fingers which extend from the first bus bar to the second bus bar side, a plurality of second electrode fingers which extend from the second bus bar to the first bus bar side and have a portion adjacent to the plurality of first electrode fingers in the propagation direction, a plurality of first dummy electrodes which extend from the first bus bar to the second bus bar side and have tips which face the tips of the plurality of second electrode fingers through a plurality of first gaps, a plurality of second dummy electrodes which extend from the second bus bar to the first bus bar side and have tips which face the tips of the plurality of first electrode fingers through a plurality of second gaps, a first additional electrode which is located between a first electrode finger and a first dummy electrode which are adjacent to each other and at a position which it closes at least a portion of a first gap when viewed in the propagation direction and which is connected to at least one of the first electrode finger or the first dummy electrode, and a second additional electrode which is located between a second electrode finger and a second dummy electrode which are adjacent to each other and at a position which it closes at least a portion of the second gaps when viewed in the propagation direction and which is connected to at least one of the second electrode finger or the second dummy electrode. In a certain range of the propagation direction of the IDT electrode, when the arrangement direction of the first gaps among the plurality of first gaps which are adjacent to each other is a third direction, the third direction is inclined relative to the propagation direction, when the arrangement direction of the second gaps among the plurality of second gaps which are adjacent to each other is a fourth direction, the fourth direction is inclined to the side the same as the side to which the third direction is inclined relative to the propagation direction, and when the inclination angle of the third direction relative to the propagation direction is a third angle θC and the inclination angle of the fourth direction relative to the propagation direction is a fourth angle θD, the third angle θC and the fourth angle θD are within the following ranges.

$6° \leq \theta C \leq 26°$ $6° \leq \theta D \leq 26°$

An acoustic wave device according to one aspect of the present invention has either of the above acoustic wave elements and a circuit board on which the acoustic wave element is mounted.

According to the above configurations, in the certain range in the propagation direction of SAW in the IDT electrode, by giving a certain angle relative to the propagation direction to the arrangement direction of the gaps constituted by intervals between the electrode fingers and the dummy electrodes, the propagation loss of the acoustic wave element can be suppressed.

DESCRIPTION OF EMBODIMENTS

Below, SAW elements and SAW devices according to embodiments of the present invention are explained with reference to the drawings. Note that, the drawings used in the following explanation are schematic ones. Dimensions, ratios, etc. on the drawings do not always coincide with the actual ones.

In the second and following embodiments, the same notations as those for the already explained embodiments are attached to the configurations which are same as or similar to the configurations of the already explained embodiments, and explanations are sometimes omitted.

<First Embodiment>

(Configuration and Method of Production of SAW Element)

Figure 1A:
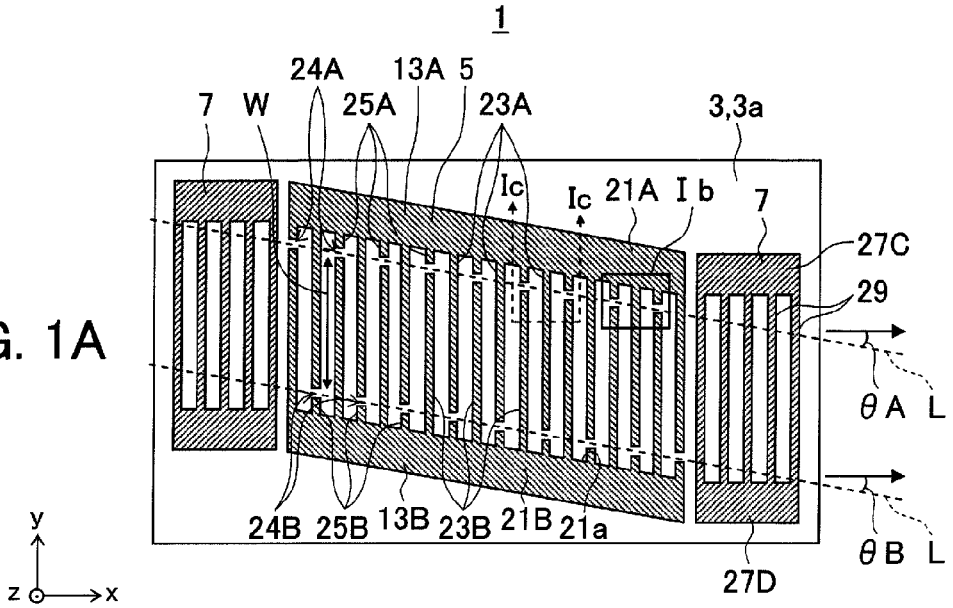
FIG. 1A is a plan view of a SAW element according to a first embodiment of the present invention.
Figure 1B:
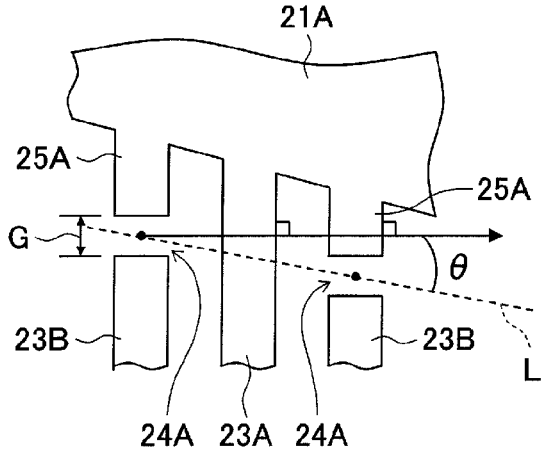
FIG. 1B is an enlarged view of a region Ib in FIG. 1A
Figure 1C:
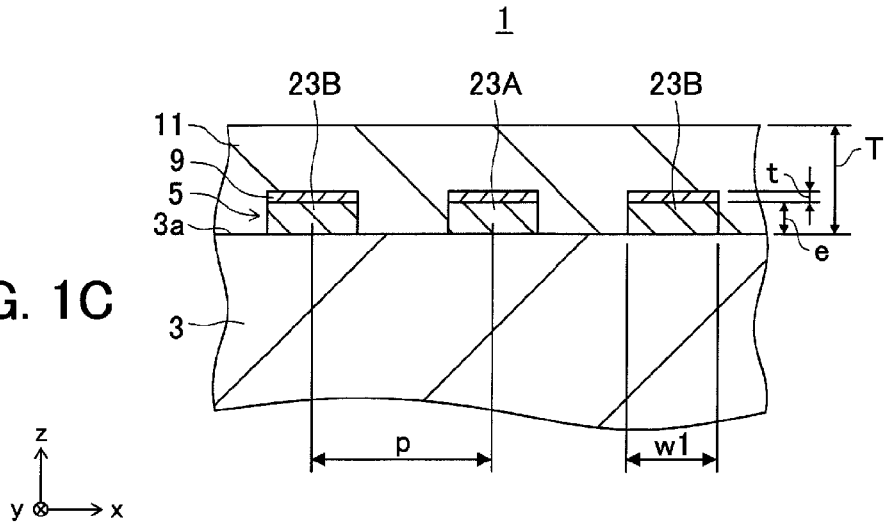
FIG. 1C is a cross-sectional view taken along an Ic-Ic line in FIG. 1A.

FIG. 1A is a plan view of principal parts of a SAW element 1 according to a first embodiment of the present invention. FIG. 1B is an enlarged view of a region Ib in FIG. 1A. FIG. 1C is a cross-sectional view taken along an Ic-Ic line in FIG. 1A.

Note that, in the SAW element 1, any direction may be made upward or downward. However, in the following description, conveniently an orthogonal coordinate system xyz is defined, and use is made of an "upper surface", "lower surface", and other terms where the positive side of the z-direction is the upper part.

The SAW element 1, as shown in FIG. 1A, has a substrate 3 and an IDT electrode 5 and reflectors 7 which are provided on an upper surface 3a of the substrate 3. Further, the SAW element 1, as shown in FIG. 1C, has added films 9 which are provided on the IDT electrode 5 and reflectors 7 and a protective layer 11 which covers the upper surface 3a from the top of the added films 9. Note that, other than these, the SAW element 1 may have lines for inputting and outputting signals to and from the IDT electrode 5 and so on.

The substrate 3 is configured by a piezoelectric substrate. For example, the substrate 3 is configured by a substrate of a single crystal having piezoelectricity such as a lithium niobate ($LiNbO_3$) single crystal. More preferably, the substrate 3 is configured by an 128°±10° Y-X cut $LiNbO_3$ substrate or 0°±10° Y-X cut $LiNbO_3$ substrate. Other than this, use can be made of a lithium tantalate ($LiTaO_3$) single crystal and so on. The planar shape and various dimensions of the substrate 3 may be suitably set. As an example, the thickness of the substrate 3 (z-direction) is 0.2 mm to 0.5 mm.

The IDT electrode 5 has a first comb-shaped electrode 13A and a second comb-shaped electrode 13B as shown in FIG. 1A. Note that, in the following description, sometimes the first comb-shaped electrode 13A and second comb-shaped electrode 13B are simply referred to as the "comb-shaped electrodes 13" and are not distinguished. Further, for configurations etc. according to the first comb-shaped electrode 13A, sometimes the terms "first" and "A" are attached for example like the "first bus bar 21A". For configurations etc. according to the second comb-shaped electrode 13B, sometimes the terms "second" and "B" are attached for example like the "second bus bar 21B". And "first", "second", "A", and "B" are sometimes omitted.

Each comb-shaped electrode 13, as shown in FIG. 1A, has two bus bars 21 facing each other, a plurality of electrode fingers 23 which extend from each of the bus bars 21 to the other bus bar 21 side and a plurality of dummy electrodes 25 which extend from each of the bus bars 21 to the other bus bar 21 side among the plurality of electrode fingers 23. Further, the pair of comb-shaped electrodes 13 are arranged so that their plurality of electrode fingers 23 mesh each other (so that they intersect each other).

The SAW propagates in a direction perpendicular to the plurality of electrode fingers 23. Accordingly, after taking the crystal orientation of the substrate 3 into account, the two bus bars 21 are arranged so that they face each other in a direction intersecting with the direction in which the SAW is desired to be propagated, and the plurality of electrode fingers 23 are formed so as to extend in the direction perpendicular to the direction in which the SAW is desired to be propagated.

Note that, the propagation direction of a SAW is defined by the orientation etc. of the plurality of electrode fingers 23. In the present embodiment, however, conveniently the orientation of the plurality of electrode fingers 23 etc. are sometimes explained using the propagation direction of SAW as the standard.

Further, the orthogonal coordinate system xyz is defined so that the x-axis is perpendicular to the electrode fingers 23 (parallel to the propagation direction of SAW), the y-axis is parallel to the electrode fingers 23, and the z-axis is perpendicular to the IDT electrode 5. That is, the orthogonal coordinate system xyz is defined not using the outer shape of the substrate 3, but using the outer shape of the IDT electrode 5 (propagation direction of SAW) as the standard (see FIG. 10).

The bus bars 21 are for example formed in a long state so as to extend with roughly a constant width and are inclined relative to the propagation direction of SAW (x-direction). Accordingly, the edge parts 21a of the bus bars 21 on the mutually facing sides exhibit linear states and are inclined to the propagation direction. The inclination angles of the bus bars 21 (edge parts 21a) are for example the same as each other between the two bus bars 21. The plurality of electrode fingers 23 are formed in the long state so as to linearly extend with roughly a constant width and are arranged in the propagation direction of SAW at roughly a constant interval. The plurality of electrode fingers 23 of the pair of comb-shaped electrodes 13 are provided so that their pitch (repetition interval) p (FIG. 1C. For example a distance between the centers of the electrode fingers 23) becomes equivalent to for example a half wavelength of the wavelength λ of the SAW at a frequency to be resonated. The wavelength λ(2p) is for example 1.5 μm to 6 μm. The width w1 (FIG. 1C) of each electrode finger 23 (FIG. 1C) is suitably set in accordance with the electrical characteristics etc. requested to the SAW element 1 and is for example 0.4p to 0.6p with respect to the pitch "p".

The lengths of the plurality of electrode fingers 23 (positions of the tips) are made the same as each other. Further, as explained above, the edge parts 21a of the two bus bars 21 (root positions of the electrode fingers 23) exhibit a linear state where they are inclined to the propagation direction and are parallel to each other. Accordingly, a line connecting the tips of the plurality of first electrode fingers 23A and a line connecting the tips of the plurality of second electrode fingers 23B exhibit a linear state where they are inclined to the propagation direction and are parallel to each other, and consequently the intersection range of the plurality of electrode fingers 23 (the range of the intersection width W (FIG. 1A)) is formed in a parallelogram. Due to this, occurrence of a so-called transverse mode spurious wave is suppressed.

The plurality of dummy electrodes 25 are for example formed in a long state where they extend in a linear state with roughly a constant width and are arranged at the center among the plurality of electrode fingers 23 (arranged with the same pitch as that of the plurality of electrode fingers 23). Further, the tips of the dummy electrodes 25 of one comb-shaped electrode 13 face the tips of the electrode fingers 23 of the other comb-shaped electrode 13 through gaps 24. The width (x-direction) of a dummy electrode 25 is for example equal to that of the electrode finger 23. The lengths (x-direction) of the plurality of dummy electrodes 25 x are for example the same as each other.

The array of the plurality of gaps 24 is inclined relative to the propagation direction. When the direction of arrangement of the first gaps 24A is defined as the first direction, the inclination angle of the first direction relative to the propagation direction (the first angle θA) is made a certain range of angle. Further, when the direction of arrangement of the second gaps 24B is defined as the second direction, the inclination angle of the second direction relative to the propagation direction (the second angle θB) is made a certain range of angle as well. The first angle θA and the second angle θB are for example the same as each other and are the same as the inclination angle of the bus bar 21 (the array of the gaps 24 and the edge parts 21a are parallel). The preferred range of the angle θ is explained later.

The gap lengths G (lengths of the gaps 24 in the y-direction) are for example the same as each other among the plurality of gap lengths G. The gap length G is for example 0.10 μm to 0.52 μm. Further, where the wavelength of the acoustic wave is λ, the gap length G is for example 0.1λ to 0.6λ. Note that, a more preferred range of the gap length G is explained later.

Note that, the angle θ is defined or measured for each adjacent two gaps 24 using for example the center positions of the gaps 24 as the standard as shown in FIG. 1B. Note, in the case where the plurality of gap lengths G are the same as each other as in the present embodiment, suitable positions may be used as the standard, for example, the tips of the electrode fingers 23 or the tips of the dummy electrodes 25. This is because when the plurality of gap lengths G are the same as each other, the measurement result of the angle θ does not change even when the tips of the electrode fingers 23 or the like are used as a standard. Further, in the case where the plurality of gaps 24 are arranged in the linear state as in the present embodiment, as shown in FIG. 1A, the angle θ may be defined or measured according to the angle formed by the line L connecting the plurality of gaps 24 and by the propagation direction of SAW. In this case, in general, the gap length G is small compared with the size of the IDT electrode 5 in the x-direction, therefore a suitable position may be determined as a standard. That is, variation of the gap lengths G is negligible.

The IDT electrode 5 is formed by for example a metal. As this metal, there can be mentioned for example Al or an alloy containing Al as the major component (Al alloy). The Al alloy is for example an Al—Cu alloy. Note that, the IDT electrode 5 may be configured by a plurality of metallic layers as well. Various dimensions of the IDT electrode 5 are suitably set in accordance with the electrical characteristics etc. requested to the SAW element 1. As an example, the thickness "e" (FIG. 1C) of the IDT electrode 5 is 50 nm to 400 nm.

Note that, the IDT electrode 5 may be directly arranged on the upper surface 3a of the substrate 3 or may be arranged on the upper surface 3a of the substrate 3 through another member. The other member is made of for example Ti, Cr, or an alloy of them. When the IDT electrode 5 is arranged on the upper surface 3a of the substrate 3 through another member in this way, the thickness of the other member is set to an extent where almost no influence is exerted upon the electrical characteristics of the IDT electrode 5 (for example a thickness of 5% based on the thickness of the IDT electrode 5 in the case of Ti).

When voltage is applied to the substrate 3 by the IDT electrode 5, a SAW which propagates in the x-direction along the upper surface 3a is induced near the upper surface 3a of the substrate 3. Further, the SAW is reflected at a boundary between the electrode finger 23 and a region in which the electrode finger 23 is not arranged (the region in a long state between the adjacent electrode fingers 23). Then, a standing wave defining the pitch "p" of the electrode fingers 23 as the half wavelength is formed. The standing wave is converted to an electrical signal having the same frequency as that of the standing wave and is extracted by the electrode fingers 23. In this way, the SAW element 1 functions as a resonator or filter.

The reflectors 7 are formed in a lattice state. That is, the reflector 7 has a third bus bar 27C and fourth bus bar 27D (hereinafter, simply referred to as the "bus bars 27", sometimes the two are not distinguished) which face each other in the direction intersecting with the propagation direction of SAW and a plurality of third electrode fingers 29 extending between these bus bars 27 in the direction perpendicular to the propagation direction of the SAW.

The bus bars 27 are for example formed in a long state where they extend in a linear state with roughly a constant width and are arranged parallel to the propagation direction of the SAW. The distance between the two bus bars 27 is for example roughly the same as the distance between the two bus bars 21 of the IDT electrode 5.

Further, the plurality of third electrode fingers 29 are formed in a long state where they extend in a linear state with roughly a constant width and are arranged at roughly the same pitch as that for the electrode fingers 23 of the IDT electrode 5. The width of a third electrode finger 29 is for example roughly equal to the width of the electrode finger 23.

The reflectors 7 are for example formed by the same material as that for the IDT electrode 5 and are formed to a thickness equivalent to that of the IDT electrode 5.

The protective layer 11 is for example provided over roughly the entire surface of the upper surface 3a of the substrate 3, covers the IDT electrode 9 and reflectors 7 which are provided with the added films 9, and covers the portion of the upper surface 3a which is exposed from the IDT electrode 5 and the reflectors 7. The thickness T (FIG. 1C) of the protective layer 11 from the upper surface 3a is set larger than the thickness "e" of the IDT electrode 5 and reflectors 7. For example, the thickness T is thicker than the thickness "e" by 100 nm or more and is 200 nm to 1500 nm. Further, for example, the thickness T is 0.2λ to 0.5λ relative to the wavelength λ of the SAW from another viewpoint.

The protective layer 11 is made of a material having an insulation property. Preferably, the protective layer 11 is formed by material by which the propagation velocity of the acoustic wave becomes fast when the temperature rises such as $SiO_2$. The change of the electrical characteristics of the SAW element 1 according to the change of the temperature can be kept small by this. Specifically, this is as follows.

When the temperature of the substrate 3 rises, the propagation velocity of the SAW on the substrate 3 becomes slower and the pitch "p" becomes larger due to a thermal expansion of the substrate 3. As a result, the resonant frequency becomes lower, so the desired characteristics are liable to not be obtained. However, when the protective layer 11 is provided, the SAW propagates not only on the substrate, but also in the protective layer 11. Further, the protective layer 11 is formed by a material ($SiO_2$) by which the propagation velocity of the acoustic wave becomes faster when the temperature rises, therefore the change of the velocity due to the temperature rise is suppressed in the SAW propagating through the substrate 3 and protective layer 11 as a whole. Note that, the protective layer 11 contributes to the protection of the IDT electrode 5 from corrosion etc. as well.

The surface of the protective layer 11 is desirably made free from large relief shapes. The propagation velocity of the SAW propagating on the substrate 3 changes when influenced by relief shapes of the surface of the protective layer 11. Therefore, if large relief shapes exist on the surface of the protective layer 11, a large variation arises in the resonant frequencies of produced SAW elements 1. Accordingly, when making the surface of the protective layer 11 flat, the resonant frequency of each SAW element is stabilized. Specifically, desirably the flatness of the surface of the protective layer 11 is made 1% or less based on the wavelength of the SAW propagating on the substrate 3.

The added films 9 are for improving the electrical characteristics of the IDT electrode 5 and reflectors 7. The added films 9 are for example provided over the entire surfaces of the upper surfaces of the IDT electrode 5 and reflectors 7. In the added films 9, the cross-sectional shape perpendicular to the longitudinal direction (y-direction) of the electrode fingers 23 is made for example approximately rectangular. Note, the cross-sectional shape of the added film 9 may be trapezoid or dome-state. The thickness "t" of the added films 9 (FIG. 1C) may be suitably set within the range where the added films 9 do not expose the protective layer 11. For example, the thickness of the added films 9 is 0.01λ to 0.4λ based on the wavelength λ of the SAW.

The material configuring the added films 9 is a material having a different acoustic impedance from those of the materials configuring the IDT electrode 5, reflectors 7, and protective layer 11. The difference of the acoustic impedance is preferably a certain extent or more. For example, it is preferably 15 MRayl or more, more preferably 20 MRayl or more.

As such materials, for example, when the IDT electrode 5 is configured by Al (acoustic impedance: 13.5 MRayl), and the protective layer 11 is configured by $SiO_2$ (12.2 MRayl), there can be mentioned WC (102.5 MRayl), TiN (56.0 MRayl), $TaSiO_2$ (40.6 MRayl), $Ta_2O_5$ (33.8 MRayl), and $W_5Si_2$ (67.4 MRayl).

When the IDT electrode 5 is comprised by Al and the protective layer 11 is comprised by $SiO_2$, these acoustic impedances are close, therefore the boundary between the electrode finger 23 and the region in which the electrode finger 23 is not arranged (the long-state region between the adjacent electrode fingers 23) becomes acoustically vague, so the reflection coefficient at the boundary falls. As a result, the reflection wave of SAW is liable to not be sufficiently obtained, so desired characteristics are not obtained. However, by provision of the added film 9 formed by a material having a different acoustic impedance from those of the IDT electrode 5 and the protective layers 11 on the upper surface of the IDT electrode 5, the reflection coefficient becomes high at the boundary between the electrode finger 23 and the region in which the electrode finger 23 is not arranged, so it becomes easy to obtain the desired characteristics.

Note that, the material of the added films 9 preferably has a slower propagation velocity of acoustic wave than those by the materials of the IDT electrode 5, reflectors 7, and protective layer 11. Due to the slow propagation velocity, the vibration distribution is apt to be concentrated at the added films 9, therefore the reflection coefficient practically becomes high at the boundary between the electrode finger 23 and the region in which the electrode finger 23 is not arranged.

As such materials, for example, when the IDT electrode 5 is comprised by Al (propagation velocity: 5020 m/s) and the protective layer 11 is comprised by $SiO_2$ (5560 m/s), there can be mentioned $TaSiO_2$ (4438 m/s), $Ta_2O_5$ (4352 m/s), and $W_5Si_2$ (4465 m/s). Note that, among the materials having slower propagation velocities of acoustic waves than those of the materials of the IDT electrode 5 etc., the degree of freedom in selection is thought to be higher in a material having a larger acoustic impedance than a material having a smaller acoustic impedance than those of the IDT electrode 5 etc.

FIG. 2A to FIG. 2E are cross-sectional views corresponding to FIG. 1C for each manufacture process and summarize of the manufacturing method of the SAW element 1. The manufacturing process advances from FIG. 2A to FIG. 2E in that order. Note that, the various types of layers change in shapes etc. along with the advance of the process. However, common notations are sometimes used before and after the change.

Figure 2A:
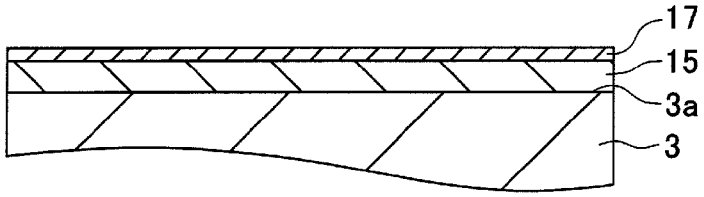
FIG. 2A to FIG. 2E are cross-sectional views corresponding to FIG. 1C for explaining a manufacturing method of the SAW element in FIG. 1.

As shown in FIG. 2A, first, on the upper surface 3a of the substrate 3, a conductive layer 15 which becomes the IDT electrode 5 and reflectors 7 and an added layer 17 which becomes the added films 9 are formed. Specifically, first, by a thin film forming method such as a sputtering process, vapor deposition process, or CVD (chemical vapor deposition) process, the conductive layer 15 is formed on the upper surface 3a. Next, by the same thin film forming method, the added layer 17 is formed.

Figure 2B:
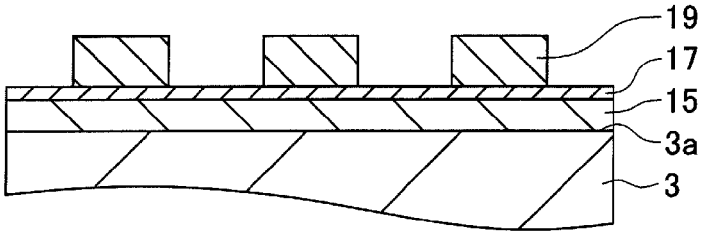

When the added layer 17 is formed, as shown in FIG. 2B, a resist layer 19 is formed as a mask for etching the added layer 17 and conductive layer 15. Specifically, a thin film of a negative type or positive type photosensitive resin is formed by a suitable thin film forming method. A portion of the thin film is removed by a photolithography process or the like at a position where the IDT electrode 5 and reflectors 7 etc. are not arranged.

Figure 2C:
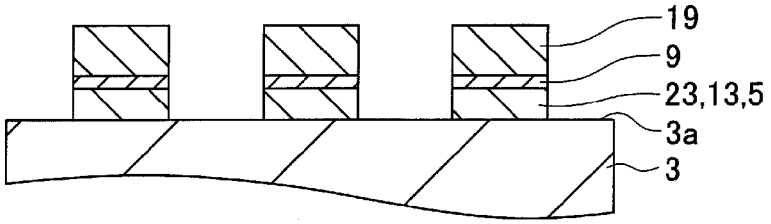
Figure 2D:
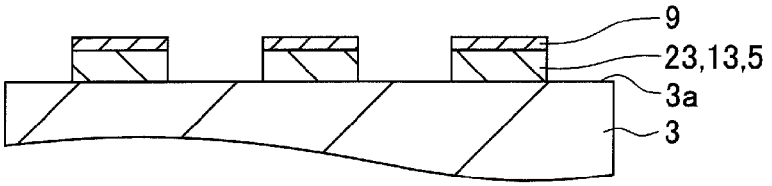

Next, as shown in FIG. 2C, a suitable etching method such as RIE (reactive ion etching) is used to etch the added layer 17 and conductive layer 15. Due to this, the IDT electrode 5 and reflectors 7 which are provided with the added films 9 are formed. After that, as shown in FIG. 2D, a suitable chemical solution is used to remove the resist layer 19.

Figure 2E:
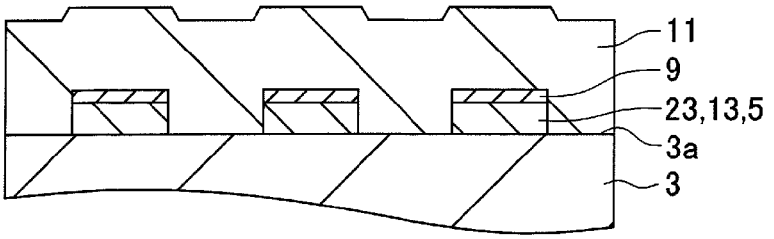

Further, as shown in FIG. 2E, a suitable thin film forming method such as the sputtering process or CVD process is used to form a thin film which becomes the protective layer 11. At this point of time, relief shapes due to thicknesses of the IDT electrode 5 etc. are formed on the surface of the thin film which becomes the protective layer 11. Further, according to need, the surface is flattened by chemical mechanical polishing or the like whereby the protective layer 11 is formed as shown in FIG. 1C. Note that, in the protective layer 11, before or after the flattening, portions may be removed by the photolithography process or the like in order to expose a pad 39 (FIG. 3) etc. which are explained later.

The above-explained processes are carried out on a mother board which is diced to form the substrates 3. Further, after the formation of the protective layer 11, another member (for example a later explained cover 33) is formed according to need. After that, the mother board is diced to prepare the SAW elements 1.

(Configuration of SAW Device)

Figure 3:
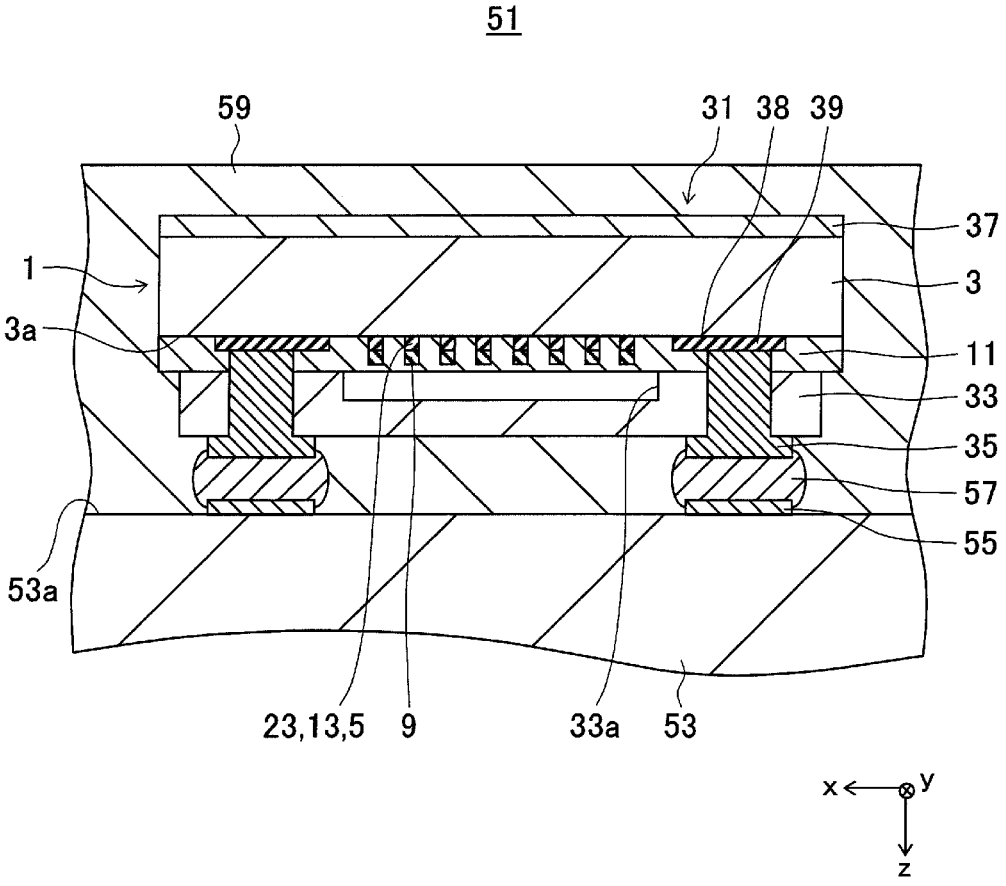
FIG. 3 A cross-sectional view which shows an example of a SAW device to which the SAW element in FIG. 1 is applied.

FIG. 3 is a cross-sectional view showing an example of a SAW device 51 to which the SAW element 1 explained above is applied.

The SAW device 51 forms for example a filter or duplexer. The SAW device 51 has a SAW element 31 and a circuit board 53 on which the SAW element 31 is mounted.

The SAW element 31 is for example configured as a SAW element of a so-called wafer level package. The SAW element 31 has the SAW element 1 explained above, a cover 33 covering the SAW element 1 side of the substrate 3, a terminal 35 passing through the cover 33, and a back surface portion 37 covering the substrate 3 on the opposite side to the SAW element 1.

The cover 33 is configured by a resin or the like and forms a vibration space 33a above the IDT electrode 5 and reflectors 7 (positive side of the z-direction) for facilitating the propagation of the SAW. On the upper surface 3a of the substrate 3, lines 38 connected to the IDT electrode 5 and pads 39 connected to the lines 38 are formed. The terminals 35 are formed on the pads 39 and are electrically connected to the IDT electrode 5. Though not particularly shown, the back surface portion 37 for example has a back surface electrode for discharging an electrical charge built up in the surface of the substrate 3 due to temperature variation etc. and a protective layer covering the back surface electrode.

The circuit board 53 is configured by for example a so-called rigid type printed circuit board. On a mount surface 53a of the circuit board 53, mount-use pads 55 are formed.

The SAW element 31 is arranged so that the cover 33 side is made to face the mount surface 53a. Further, the terminals 35 and the mount-use pads 55 are bonded by solders 57. After that, the SAW element 31 is sealed by a seal resin 59.

Figure 4A:
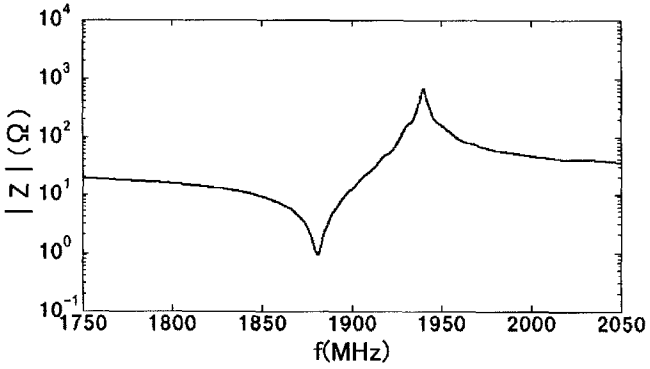
FIG. 4A to FIG. 4D are views which show the effects according to suppression of a transverse mode spurious wave.
Figure 4B:
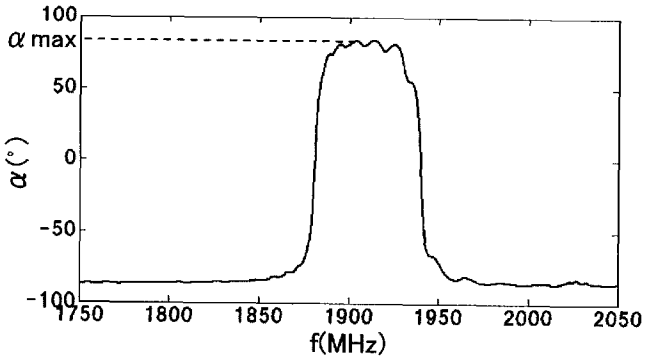
Figure 4C:
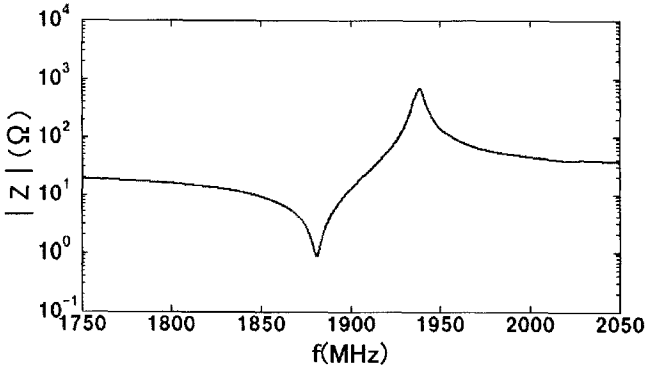
Figure 4D:
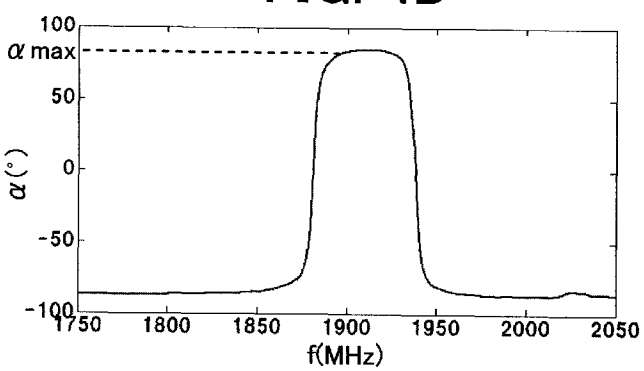

FIG. 4A to FIG. 4D are views for explaining the effects regarding suppression of the transverse mode spurious wave in the SAW element 1. Specifically, FIG. 4A and FIG. 4B show the impedance characteristics of the SAW elements in comparative examples, and FIG. 4C and FIG. 4D show the impedance characteristics of the SAW element 1. The comparative examples show SAW elements where the angle θ is 0°.

Note that, FIG. 4 are based on experiments according to comparative examples and examples which are explained later. Specifically, FIG. 4A and FIG. 4B illustrate the impedance characteristics of comparative examples) (θ=0°) at the time when the gap length G is 0.36 μm, and FIG. 4C and FIG. 4D illustrate the impedance characteristics of examples where the gap length G is 0.36 μm and the angle θ is 10°.

In FIG. 4A to FIG. 4D, the abscissas show the frequencies "f". In FIG. 4A and FIG. 4C, the ordinates show absolute values |Z| of impedance, while the ordinates show phases a of the impedances "Z" in FIG. 4B and FIG. 4D.

As shown in FIG. 4A and FIG. 4C, in the SAW element 1, there are a resonance point at which the absolute value |Z| of impedance becomes the local minimum and an anti-resonance point at which the absolute value |Z| of impedance becomes the local maximum. Further, as shown in FIG. 4B and FIG. 4D, between the resonance point and the anti-resonance point, the phase α of the impedance becomes the maximum phase αmax.

Further, in comparative examples (FIG. 4A and FIG. 4B), between the resonance point and the anti-resonance point, the lines showing the absolute values |Z| and the phases of impedances undulate. That is, a higher order transverse mode spurious wave occurs. On the other hand, in the examples, occurrence of a higher order transverse mode spurious wave is suppressed.

In this way, by inclination of the array of the gaps 24 by the angle θ relative to the propagation direction of SAW, occurrence of a spurious wave is suppressed. This is considered to be due to mutual deviation of positions in the y-direction (phases) of waves in the higher order transverse mode in accordance with the positions in the x-direction.

(Preferred Ranges of Angle θ and Gap Length G)

In the SAW element 1, when suitably setting the angle θ etc., not only an effect of suppression of a spurious wave, but also an effect of suppression of propagation loss are exerted. In the following description, the effects are shown in the examples. The preferred ranges of the angle θ etc. are explained mainly from the viewpoint of suppression of the propagation loss.

A plurality of SAW elements (SAW elements of comparative examples and examples) in which the angles θ and gap lengths G were made different from each other were prepared and measured for their impedances etc.

The settings of the plurality of comparative examples and plurality of examples were as follows.

Angle θ: Change from 0° up to 30° in increments of 2° (16 types)

Gap length G: 0.25 μm, 0.36 μm, 0.45 μm, and 0.58 μm (four types)

Note that, no SAW element was prepared for the four types where the gap lengths G are 0.25 μm or 0.36 μm and the angles θ are 28° or 30°. However, as understood from the contents of study which are explained later, there is no influence upon the study of the preferred ranges of the angle θ and gap length G.

Further, in the prepared SAW elements, the first angles θA formed by the adjacent first gaps 24A were made equal to each other in the entire range of the IDT electrodes 5. The second angles θB formed by the adjacent second gaps 24B were made equal to each other in the entire range of the IDT electrodes 5 as well, and the second angles θB were made equal to the first angles θA.

As described above, SAW elements were prepared and the impedance characteristics were measured for four types of comparative examples (θ=0°) and 56 types of examples.

The conditions common to the comparative examples and examples are shown below.

Substrate 3: 126° YX—$LiNbO_2$ substrate

Conductive layer 15 (IDT electrode/reflector):

- Material: Al—Cu alloy
- Note, there is an underlying layer made of Ti of 6 nm between the substrate 3 and the conductive layer 15.
- Thickness "e" (Al—Cu alloy layer): 141 nm Added films:

- Material: $Ta_2O_5$
- Thickness "t": 90 nm

Protective layer:

- Material: $SiO_2$
- Thickness T: 600 nm

Electrode fingers of IDT electrode:

- Pitch "p": 0.92 μm
- Duty (wl/p): 0.5
- Number: 250
- Intersection width W: 46 μm Dummy electrode length: 4 μm Number of electrode fingers of reflector: 30

The propagation loss in the comparative examples and examples was evaluated based on the maximum phase αmax (see FIG. 4D). There is a correlation between the propagation loss and the maximum phase αmax. The smaller the propagation loss, the larger the maximum phase αmax. In an ideal state where the loss is 0, the maximum phase αmax becomes) 90(°).

Figure 5:
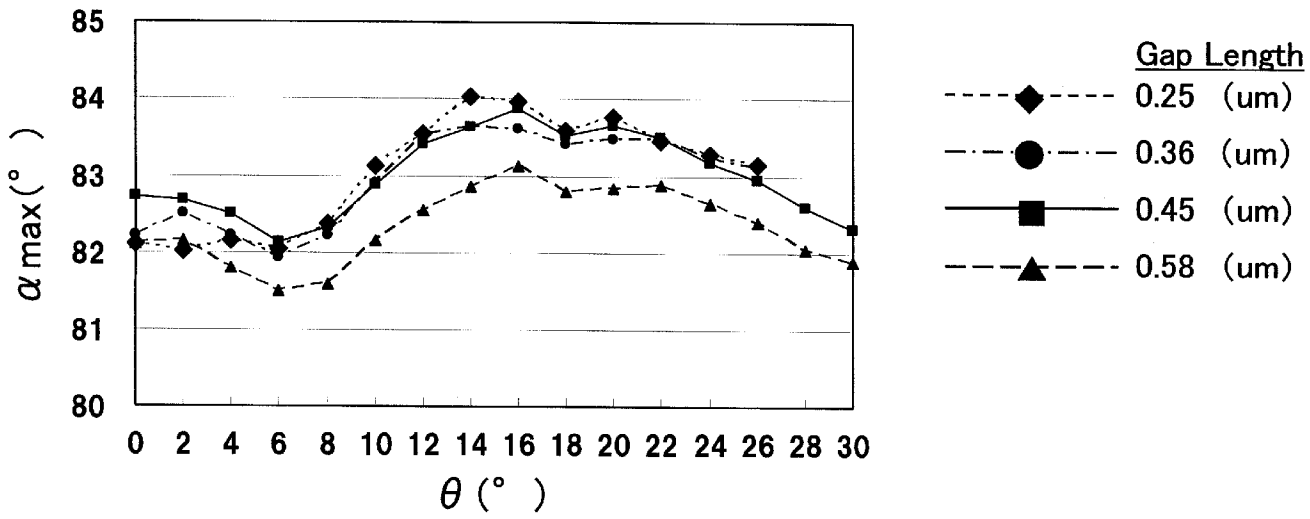
FIG. 5 A view which shows the maximum phases in comparative examples and examples.

FIG. 5 is a diagram which shows the maximum phases αmax in the comparative examples and examples. The abscissa shows the angles (θ), and the ordinate shows the maximum phases αmax (°). The plotted points show the angles θ and maximum phases αmax in the comparative examples and examples and are connected by a line for each gap length G.

(Preferred Range of Angle θ)

It is seen that, for all of the four types of gap lengths G, when θ is made larger from θ=0° up to θ=6°, the maximum phase αmax becomes smaller, and the propagation loss becomes larger. However, it is seen that, when θ is made further larger from θ=6°, the maximum phase αmax becomes larger and the propagation loss conversely becomes smaller.

When θ becomes equal to 10°, the maximum phase αmax can be made larger than that at the time when θ=0°. On the other hand, as shown in FIG. 4A to FIG. 4D, by changing θ=0° to θ=10°, suppression of a transverse mode spurious wave is enabled. That is, suppression of propagation loss and suppression of the higher order transverse mode suppression wave are both achieved.

When θ is made further larger from θ=10°, the maximum phase αmax further becomes larger. The maximum phase αmax become the maximum near θ=12° to 16°. Accordingly, near θ=12° to 16°, suppression of propagation loss and suppression of the spurious wave are both achieved the most.

When θ is further made larger, the maximum phase αmax falls. Note, up to when θ=26°, the maximum phase αmax can be made larger than that when θ=0°.

As described above, for the angle θ, the suppression of propagation loss and the suppression of the spurious wave can both be achieved when 10°≤θ≤26°, so this is preferred. Further, as a more preferred range, there can be mentioned 12°≤θ≤16°.

(Preferred Range of Gap Length G)

As shown in FIG. 5, even when the gap length G becomes larger such as 0.25 μm, 0.36 μm, and 0.45 μm, no large difference is seen in the maximum phase αmax. In particular, within the preferred range of the angle θ explained above, no large difference is seen in the maximum phase αmax according to the gap length G. On the other hand, when the gap length G becomes 0.58 μm, the maximum phase αmax largely falls compared with the time when the gap length G has another value.

Figure 6:
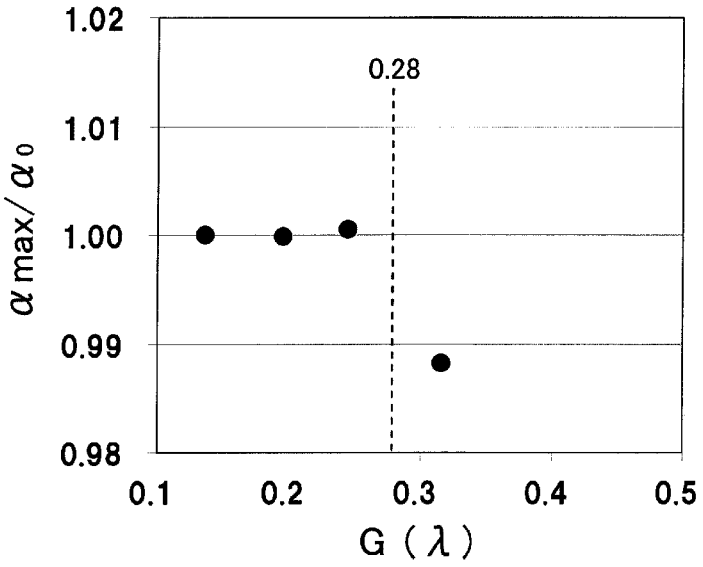
FIG. 6 A diagram which shows the maximum phase ratio for each gap length G in the examples.

FIG. 6 is a diagram which shows the maximum phase ratio for each gap length G in the examples. In FIG. 6, the abscissa shows the gap length G in terms of the ratio relative to the wavelength λ, and the ordinate shows the maximum phase ratio.

The maximum phase ratio is calculated according to αmax/α0 assuming the maximum phase αmax in the example wherein the gap length G is the minimum (0.25 μm) as the standard maximum phase α0 (the maximum phase ratio is 1 when the gap length G is 0.25 μm). Note that, FIG. 6 exemplifies a case where θ=12°.

As shown in this diagram, at the boundary where the gap length G is near 0.28λ, the ratios are divided into a region in which the maximum phase ratio is high and the effect of suppression of the propagation loss is good and a region in which, compared with the former region, the maximum phase ratio is low and the effect of suppression of the propagation loss falls.

Figure 7A:
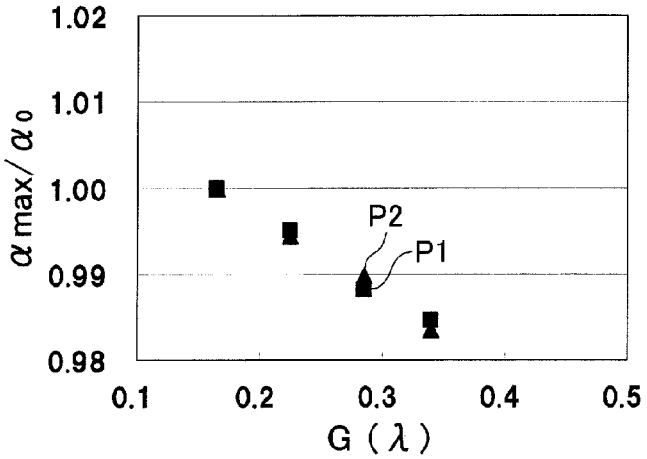
FIG. 7A to FIG. 7C are views which show the configurations of comparative examples and the maximum phase ratios.
Figure 7B:
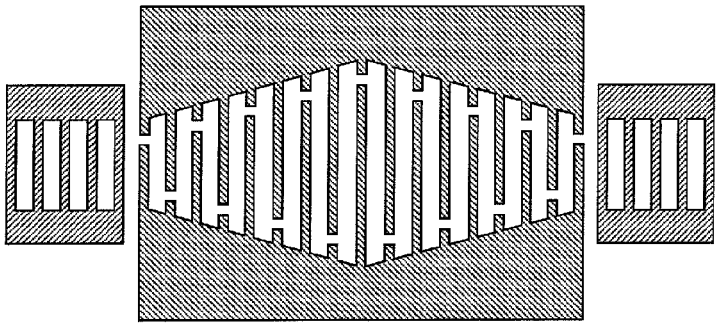
Figure 7C:
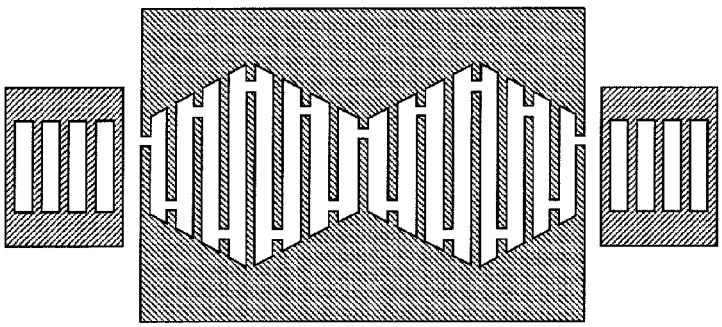

Here, a diagram the same as FIG. 6 in apodize resonators which change in the intersection width (SAW elements in other comparative examples) which are shown in FIG. 7B and FIG. 7C is shown in FIG. 7A. The SAW elements in these comparative examples are aimed at suppression of the transverse mode spurious wave.

In the SAW elements in the comparative examples shown in FIG. 7B and FIG. 7C, the number of the electrode fingers is determined to 300 so that their electrostatic capacity becomes roughly equal to that of the SAW elements in the examples. The other conditions are the same as the conditions in the examples except for the length of the electrode fingers. Note that, in the SAW elements in FIG. 7B and FIG. 7C, the maximum intersection width is 55 μm, and the minimum intersection width is 11 μm.

In FIG. 7A, a rectangular point P1 shows the maximum phase ratio in the comparative example in FIG. 7B, and a triangular point P2 shows the maximum phase ratio in the comparative example in FIG. 7C. Note that, at the time when the gap length G is 0.25 μm, the points P1 and P2 are super-imposed on each other.

As shown in FIG. 7A, in these comparative examples, along with the increase of the gap length G, the maximum phase ratio gradually (linearly) falls. That is, in these comparative examples, there occurs no phenomenon as in the examples in which the maximum phase ratio rapidly falls from a certain length of the gap length G.

Accordingly, it is seen that the examples and comparative examples all suppress the transverse mode spurious wave, but differ in the influences of the gap lengths G exerted upon the propagation loss.

As described above, preferably the gap length G is 0.28λ or less. Further, a critical significance is recognized in the upper limit value. As low as possible a lower limit value of the gap length G is preferred from the viewpoint of the suppression of the propagation loss, but in practice, the electrode fingers 23 and the dummy electrodes 25 are liable to short-circuit due to manufacturing error etc. when the gap length G is too small. And the gap length G is preferably 0.1 μm or more. Accordingly, the gap length G (μm) is preferably 0.1≤G≤0.28λ.

As explained above, the propagation loss can be suppressed while suppressing the transverse mode spurious wave by arranging the plurality of first gaps 24A in a direction inclined relative to the propagation direction, arranging the plurality of second gaps 24B in a direction inclined to the side the same as the side to which the array of first gaps 24A is inclined relative to the propagation direction, and controlling the angle θ to the preferred range (10°≤θ≤26°).

Further, by control of the gap length G (μm) to the preferred range (0.1≤G≤0.28λ), the influence of the change of the gap length G exerted upon the maximum phase αmax becomes small. As a result, the occurrence of variation in impedance characteristics according to manufacturing error etc. is suppressed as well.

Further, in the first embodiment, the plurality of first angles θA relating to the plurality of first gaps 24A are the same as each other, the plurality of second angles θB relating to the plurality of second gaps 24B are the same as each other, and the plurality of first angles θ and the plurality of second angles θ are the same as each other.

Accordingly, the configuration is simple, therefore it is easy to predict the influences of the angle θ and gap length G explained above. As a result, design is facilitated. Further, the intersection widths W become constant. Therefore, compared with the comparative examples which are exemplified in FIG. 7, the maximum intersection width for obtaining the same electrostatic capacity can be made shorter. That is, the aspect ratio can be made smaller. As a result, concentration of power at the center of the IDT electrode can be eased, therefore the power ratio is improved.

The edge part 21a of the first bus bar 21A which is on the second bus bar 21B side extends with an inclination to the same side as the side of inclination of the plurality of first gaps 24A relative to the propagation direction so that it becomes parallel to the array of the first gaps 24A rather than extension in the propagation direction. The same is true for the edge part 21a of the second bus bar 21B which is on the first bus bar 21A side.

Accordingly, compared with the third embodiment (FIG. 9) etc. which are explained later, the distance between the bus bars 21 and the intersection range of electrode fingers 23 can be made uniform and shorter. As a result, voltage can be equally applied to the intersection range while making the resistance smaller. Note that, the edge part 21a is preferably parallel to the array of the plurality of gaps 24, but may not be exactly parallel. Compared with the case where the edge part 21a extends in the propagation direction of the SAW, so long as the edge part 21a has become parallel to the array of the gaps 24, the above-described effects are somewhat exerted.

Further, in the first embodiment, the setting of the angle θ, the setting of the gap length G, the setting of the shape of the bus bar 21, and so on explained above are performed over the entire propagation direction of the SAW of the IDT electrode 5. Accordingly, in comparison with the second embodiment (FIG. 8) etc. which is explained later, the above-explained effects are exerted to the maximum.

<Second Embodiment>

Figure 8:
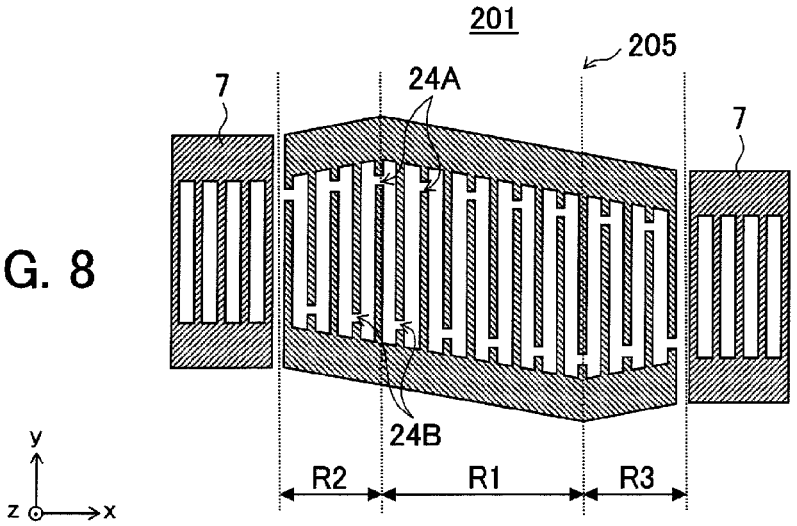
FIG. 8 A plan view which shows principal parts of a SAW element according to a second embodiment.

FIG. 8 is a plan view showing principal parts of a SAW element 201 according to a second embodiment.

In an IDT electrode 205 of the SAW element 201, the preferred conditions explained above relating to the angle θ of the gaps 24, gap length G, or the shape of the bus bars etc. are satisfied in only a partial range (range R1) of the propagation direction of the SAW (x-direction).

For example, in the range R1, the plurality of first gaps 24A are arranged in a direction inclined relative to the propagation direction, and the plurality of second gaps 24B are arranged in a direction inclined to the side the same as the side to which the array of the first gaps 24A is inclined relative to the propagation direction. Further, the inclination angle θ of the direction of arrangement of the first gaps 24A which are adjacent to each other relative to the propagation direction and the inclination angle θ of the direction of arrangement of the second gaps 24B which are adjacent to each other relative to the propagation direction, defined as exemplified in FIG. 1C, are $10° \leq \theta \leq 26°$.

Further, the conditions of the angle θ described above are not satisfied in the ranges (R2 and R3) other than the range R1, for example. FIG. 8 exemplifies a case where the array of the first gaps 24A and the array of the second gaps 24B are inclined to the reverse sides to each other relative to the propagation direction.

In the second embodiment as well, in the same way as the first embodiment, the effect of suppression of the spurious wave and the effect of suppression of propagation loss are obtained. Further, in the second embodiment, the IDT electrode in the first embodiment is combined with an IDT electrode having a varying intersection width or an IDT electrode in which the angle θ is not within the preferred range explained above or another IDT electrode, therefore it is expected to realize a more preferred IDT electrode by balancing the embodiments so that the desired characteristics are obtained as a whole while adopting the advantages of each IDT electrode.

Note that, as shown in FIG. 1B, for specifying the direction of arrangement of the plurality of gaps 24, at least two gaps 24 are necessary. Further, the first gap 24 and the second gap 24 are deviated from each other in the position of the propagation direction (they become alternate). Accordingly, for judgment of whether the direction of arrangement of the plurality of first gaps 24A and the direction of arrangement of the plurality of second gaps 24B are inclined to the same side relative to the propagation direction within the same range of the propagation direction, at least two first gaps 24A and one second gap 24B located between these two first gaps 24A and one second gap 24B which is adjacent to that are necessary. In other words, the smallest size of the range R1 is a range extending over four electrode fingers 23.

<Third Embodiment>

Figure 9:
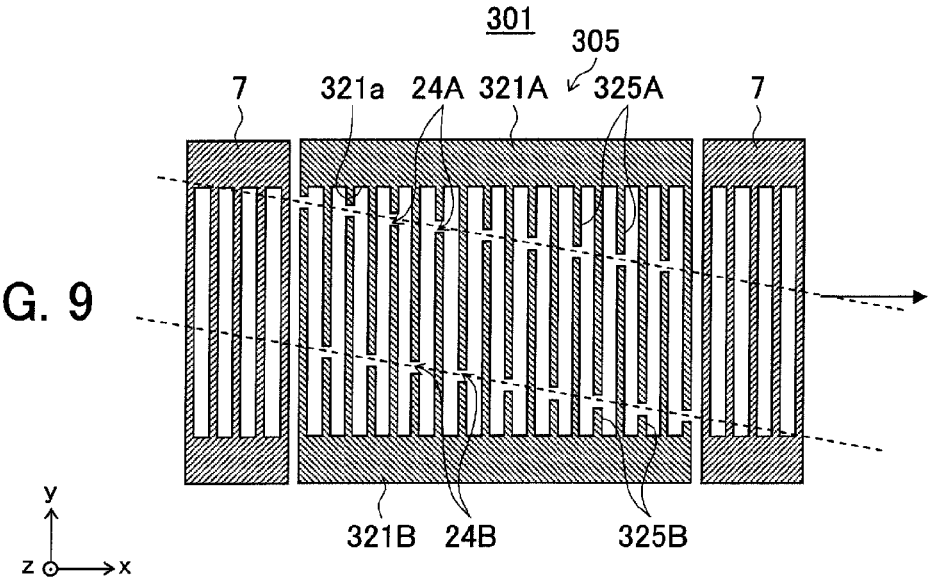
FIG. 9 A plan view which shows principal parts of a SAW element according to a third embodiment.

FIG. 9 is a plan view showing principal parts of a SAW element 301 according to a third embodiment.

In an IDT electrode 305 of the SAW element 301, the bus bars 321 (edge part 321a) do not become parallel relative to the array of the plurality of gaps 24. More specifically, they become parallel to the propagation direction of SAW (x-direction). Note that, along with this, the plurality of dummy electrodes 325 differ in length from each other.

In the third embodiment as well, in the same way as the first embodiment, the effect of suppression of a spurious wave and the effect of suppression of propagation loss are obtained. Further, the third embodiment has bus bars 321 the same as those of the conventional IDT electrode, therefore it is expected that the design changes can be kept small.

Note that, in the SAW element 1 according to the first embodiment, compared with the SAW element 301 according to the third embodiment, the resistance of the SAW element can be made smaller by the amount of shortening of the dummy electrodes 25.

<Fourth Embodiment>

Figure 10:
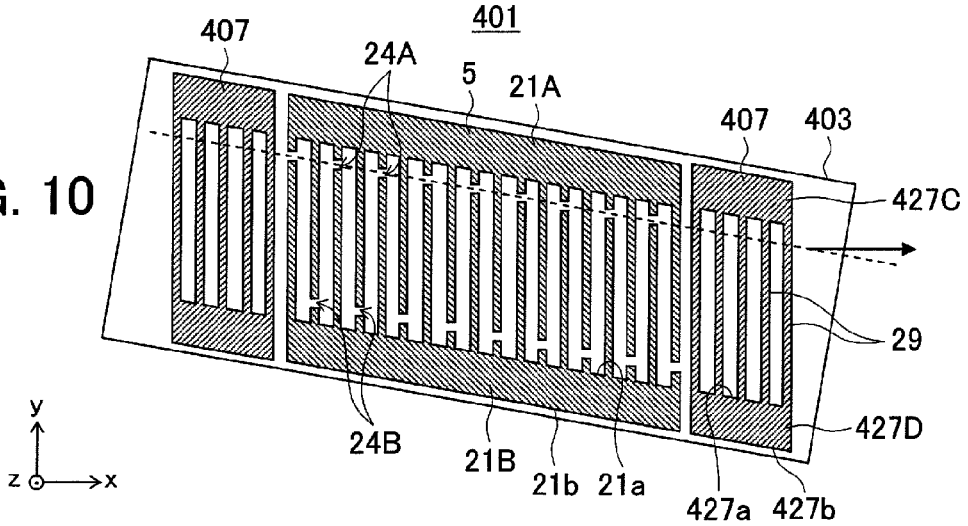
FIG. 10A plan view which shows principal parts of a SAW element according to a fourth embodiment.

FIG. 10 is a plan view showing principal parts of a SAW element 401 according to a fourth embodiment.

The SAW element 401 is different from the first embodiment first of all in the shape of the reflectors. That is, the reflectors 407 of the SAW element 401 have bus bars 427 which are parallel to the array of the gaps 24. More specifically, the bus bars 427 are positioned on roughly the same straight lines as the bus bars 21 of the IDT electrode 5. Further, edge parts (21a, 21b, 427a, and 427b) of these bus bars 21 and 427 on the electrode finger side and the side opposite to the former are positioned on roughly the same straight lines parallel to the array of the plurality of gaps 24 as well.

In this way, by inclination of the edge part 427a on the other bus bar 427 side of each bus bar 427 of the reflector 407 relative to the propagation direction, occurrence of the transverse mode spurious wave in the reflector 407 is suppressed. Further, by the edge parts 427a becoming parallel to the array of the plurality of gaps 24, the continuity between the IDT electrode 5 and the reflector 407 is secured in the effect of deviation of the higher order transverse mode wave, therefore it is expected that prediction of the effect of suppression of a spurious wave will become easy, excessive change of the vibration mode will be suppressed, and the propagation loss will be suppressed Further, in the SAW element 401, a substrate 403 has an outer edge (dicing line) extending parallel to the edge parts 21a and 427a on inner sides of the bus bar 21 and bus bar 427. Accordingly, the substrate 3 is small in size.

Note that, the edge parts 427a and 427b of the bus bar 427 do not have to be exactly parallel to the array of the gaps 24. So long as the parts become parallel to the array of the gaps 24 compared with the case where they extend in the propagation direction, the above effects are somewhat exerted. In the same way, the outer edge of the substrate 403 does not have to be exactly parallel to the edge part 21b of the bus bar 21 or the edge part 427a of the bus bar 427 and may be parallel to these edge parts compared with the case where they extend in the propagation direction.

<Fifth Embodiment>

Figure 11:
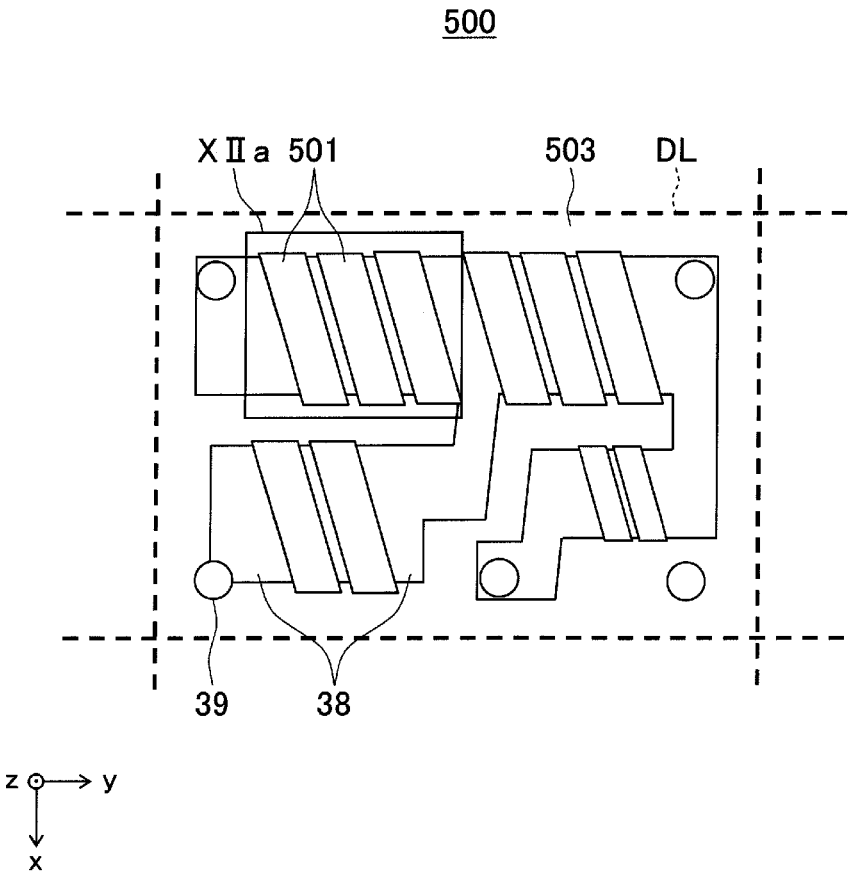
FIG. 11 A plan view which schematically shows principal parts of a duplexer according to a fifth embodiment.

FIG. 11 is a plan view which schematically shows principal parts of a duplexer 500 according to a fifth embodiment. Note that, FIG. 11 shows only a portion of a transmission side element between the transmission side element and reception side element of the duplexer 500 for convenience.

The duplexer 500 has a substrate 503 (corresponding to the substrate 3 in the first embodiment) having an outer edge formed by a dicing line DL indicated by broken lines. Further, in the substrate 503, by provision of a plurality of IDT electrodes 5 and reflectors 7 etc. which are not shown in FIG. 11, a plurality of SAW elements 501 are provided. The plurality of SAW elements 501 (IDT electrodes 5) are connected by lines 38 by a method of serial connection or parallel connection or the like, and configure a ladder type SAW filter. The circles located at the edge parts of the lines 38 are outer connection pads 39.

Note that, the duplexer 500 may be grasped as one SAW element as a whole, or partial SAW elements 501 which are included in the duplexer 500 (for example three SAW elements 501) may be grasped as one SAW element.

Figure 12A:
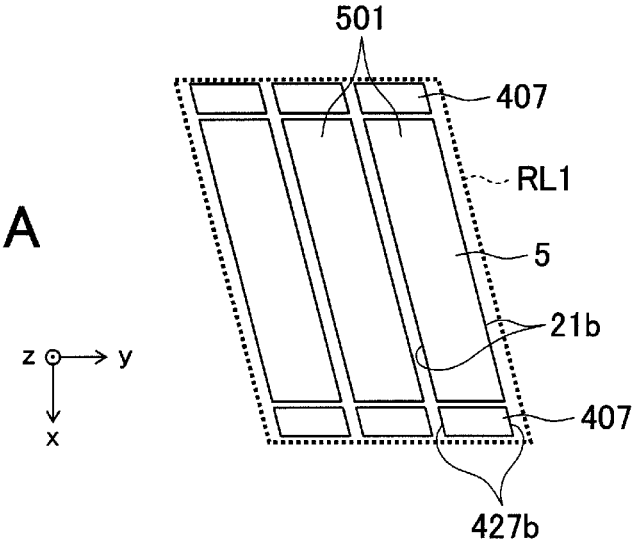
FIG. 12A to FIG. 12C are views for explaining the mode of operation of the duplexer in FIG. 11.

FIG. 12A is a schematic diagram which shows a region XIIa in FIG. 11 enlarged.

The SAW element 501 of the duplexer 500 has the IDT electrode 5 and reflectors 407 in the fourth embodiment. That is, the IDT electrode 5 and reflectors 407 are formed as a parallelogram as a whole. Further, in the range shown in FIG. 12A, the plurality of (three) SAW elements 501 are arranged in a line in a direction perpendicular to the propagation direction of the SAW so as to make the edge parts 21b and 427b of the bus bar 21 and bus bar 427 (see FIG. 10) adjacent parallel to each other. Further, these SAW elements 501 are connected in series to each other. Note that, three SAW elements 501 may be grasped as elements obtained by dividing one SAW element into three so that its electrostatic capacity is maintained. Further, the bus bars of the SAW elements 501 which are adjacent to each other may be shared between two SAW elements 501 as well. In this case, by making the arrangement direction of the first gaps 24A and the arrangement direction of the second gaps 24B parallel and by making the first gaps 24A of the adjacent SAW elements 501 parallel to each other, useless space between the adjacent SAW elements 501 can be reduced to almost zero, therefore the duplexer 500 can be reduced in size.

Figure 12B:
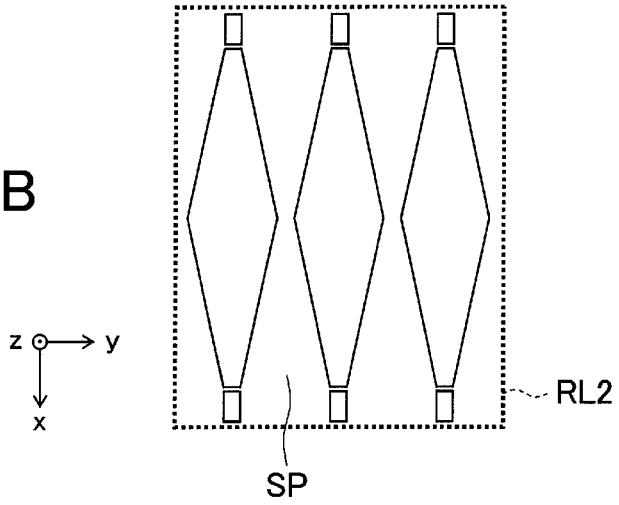
Figure 12C:
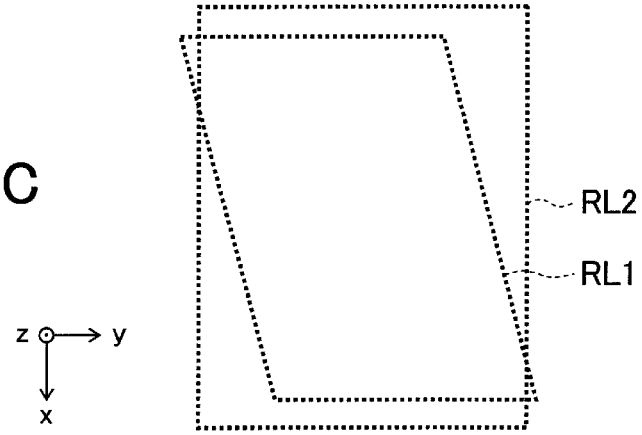

Referring to FIG. 12B and FIG. 12C, the mode of operation of the duplexer 500 is explained. FIG. 12B is a plan view corresponding to FIG. 12A of the SAW element according to a comparative example.

The SAW elements according to the comparative example shown in FIG. 12B change in intersection width in the same way as the comparative example shown in FIG. 7B. The intersection range is formed in a rhombus shape in which the propagation direction of the SAW and the direction perpendicular to the propagation direction are the diagonal directions. Further, in the same way as the SAW elements 501 in FIG. 12A, the SAW elements in the comparative example are arranged in a line in a direction perpendicular to the propagation direction of the SAW.

As understood from the comparison of FIG. 12A and FIG. 12B, in the comparative example in FIG. 12B, useless space SP is formed between the SAW elements.

FIG. 12C is a plan view shown by superimposing a dotted line RL1 surrounding the three SAW elements 501 in FIG. 12A and a dotted line RL2 surrounding the three SAW elements of the comparative example in FIG. 12B on each other. Note that, the three SAW elements in FIG. 12A and the three SAW elements in FIG. 12B are the same as each other in electrostatic capacity.

As shown in FIG. 12C, the area of the region surrounded by the dotted line RL1 in the present embodiment is smaller than the area of the region surrounded by the dotted line RL2 in the comparative example. This is due to the influence of the formation of useless space SP in the comparative example as explained above. Note that, the SAW element in the comparative example is influenced also by the necessity of increase of the number of electrode fingers and so on in order to secure the capacity since the intersection width varies (since there are regions where the intersection width becomes narrow).

As described above, in the duplexer of the present embodiment, the edge part 21a of the first bus bar 21A which is on the opposite side to the second bus bar 21B extends with an inclination relative to the propagation direction to the side the same as the side to which the plurality of first gaps 21A are inclined so that it becomes parallel with respect to the array of the first gaps 24A rather than extension in the propagation direction (x-direction). This is the same for the second bus bar 21B as well. Further, the plurality of IDT electrodes 5 are arranged in the direction (y-direction) perpendicular to the propagation direction.

Accordingly, as explained with reference to FIG. 12, the duplexer 500 can be reduced in size by suppressing the formation of useless space SP. Note that, even when the first IDT electrode 5 and reflectors 7 in the first embodiment are arranged in the direction perpendicular to the propagation direction in place of the IDT electrode 5 and reflectors 407 in the fourth embodiment, the formation of useless space SP is suppressed. That is, the reflector need not be a parallelogram.

<Sixth Embodiment>

Figure 13:
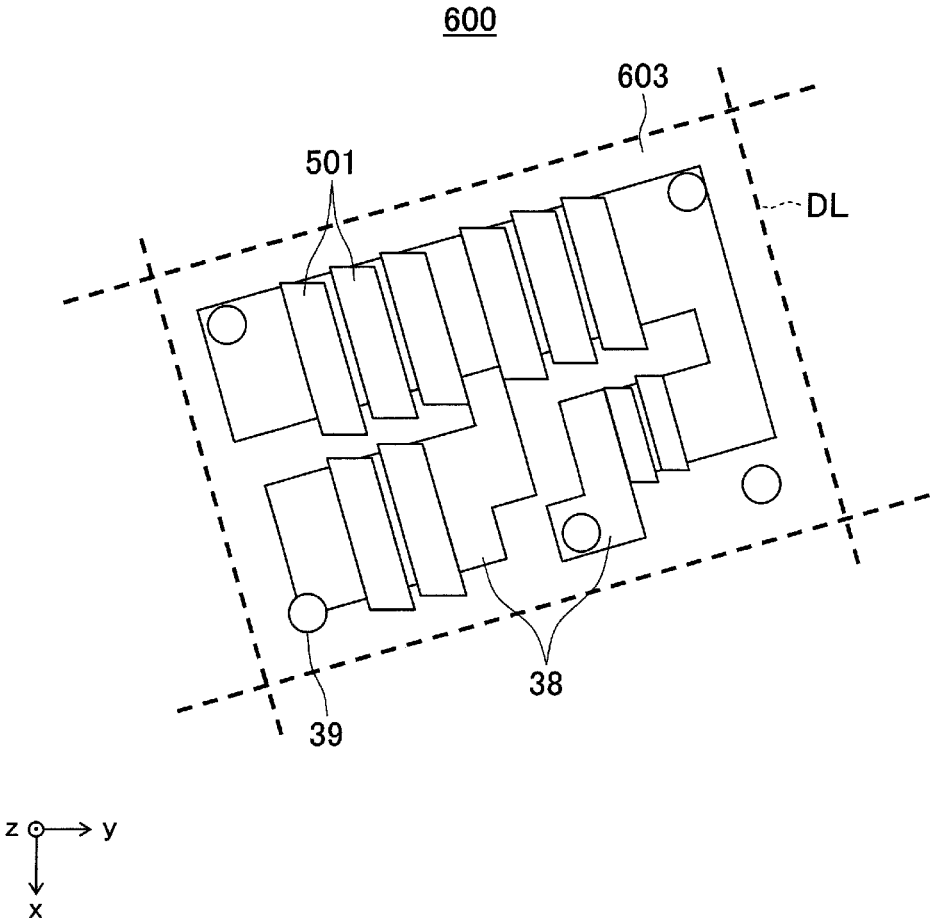
FIG. 13 A plan view which schematically shows principal parts of a duplexer according to a sixth embodiment.

FIG. 13 is a plan view schematically showing principal parts of a duplexer 600 according to a sixth embodiment.

The duplexer 600 differs from the duplexer 500 in the fifth embodiment only in the position of the dicing line DL. Specifically, in the duplexer 600, a portion of the dicing line DL extends parallel to the direction of arrangement of the plurality of gaps 24 which are not shown in FIG. 13 and to the edge parts 21a and 21b of the bus bar 21 and so on in the same way as the fourth embodiment (FIG. 10).

Accordingly, the duplexer 600 can be further reduced in size more than the fifth embodiment. Note that, the dicing line DL does not have to become exactly parallel to the array of the gaps 24. So long as it is parallel to the array of the gaps 24 compared with the case where it extends in the propagation direction, the above effects are somewhat exerted.

<Seventh Embodiment>

Figure 14A:
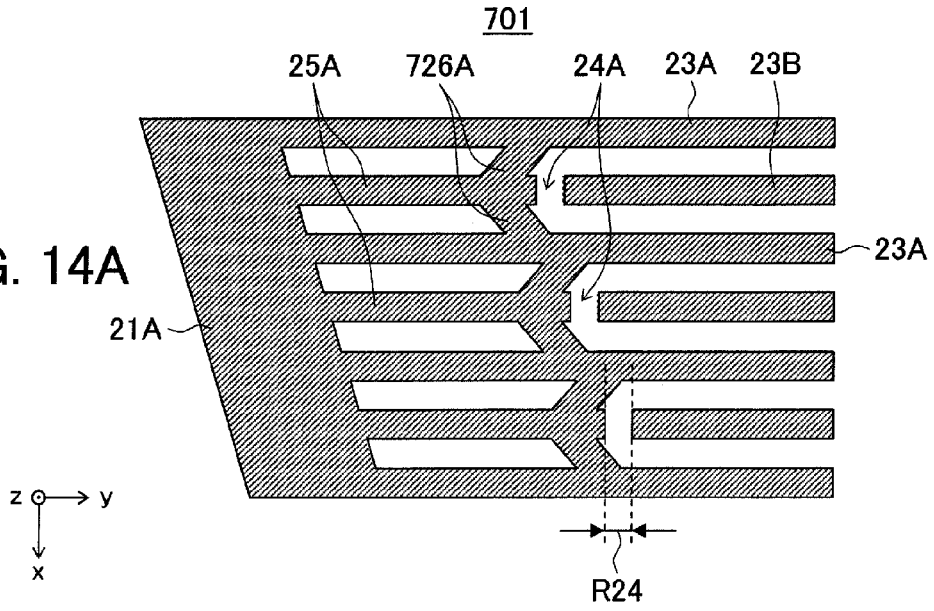
FIG. 14A to FIG. 14C are views for explaining a SAW element according to a seventh embodiment.

FIG. 14A is a partially enlarged plan view showing principal parts of a SAW element 701 according to a seventh embodiment.

In the SAW element 701, first additional electrodes 726A projecting from the lateral sides of the tip portions of the first dummy electrodes 25A to the first gap 24A side are provided. The first additional electrodes 726A are connected to the first electrode fingers 23A adjacent to the first dummy electrodes 25A as well. Note that, though not particularly shown, additional electrodes 726 are provided in the same way also on the second gap 24B side.

Further, as shown in a range R24, when viewed in the propagation direction of SAW, at least portions of the gaps 24 are closed by the additional electrodes 726. Accordingly, scattering of the SAW in the gaps 24 is suppressed.

Figure 14B:
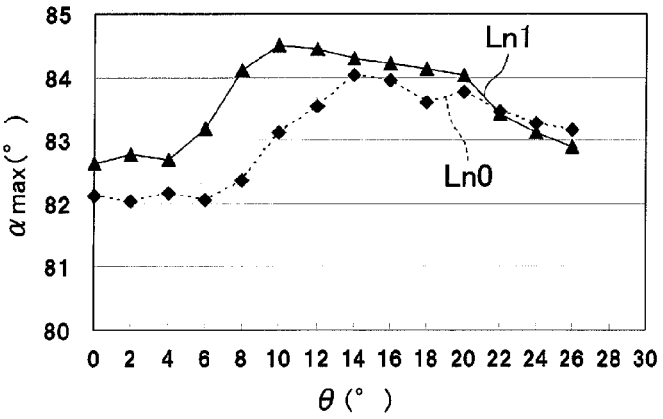

FIG. 14B is a diagram the same as FIG. 5 which shows the maximum phase $\alpha$max of an example according to the present embodiment, in which a dotted line Ln0 shows the maximum phase $\alpha$max in a case where there are no additional electrodes 726, and a solid line Ln1 shows the maximum phase $\alpha$max where there are additional electrodes 726.

Note that, the dotted line Ln0 is for the case having a gap length G of 0.25 μm and is based on data the same as that shown in FIG. 5. Further, the solid line Ln1 is for the case having a gap length G of 0.30 μm. Conditions other than the additional electrodes 726 are the same as those for the examples in FIG. 5.

As shown in this diagram, in the example of the present embodiment indicated by the solid line Ln1, irrespective of the gap length G becoming larger compared with the example of the first embodiment indicated by the dotted line Ln0, the maximum phase $\alpha$max generally becomes larger. That is, by provision of the additional electrodes 726, propagation loss is suitably suppressed.

By the same technique as that for deriving the preferred range of the angle $\theta$ based on FIG. 5, the preferred range of the angle $\theta$ was derived based on FIG. 14. Note that, in a prepared SAW element 701, third angles $\theta$C formed by the first gaps 24A being adjacent to each other were made equal to each other in the entire range of the IDT electrode 5. fourth angles $\theta$D formed by the second gaps 24B being adjacent to each other were made equal to each other in the entire range of the IDT electrode 5 as well, and the fourth angles $\theta$D were made equal to the third angles $\theta$C. The preferred range of the angle θ (the third angles θC and fourth angles θD) is 6°≤θ≤26°, more preferably 8°≤θ≤20°.

Note that, the additional electrodes 726 close the gap length G and suppress the propagation loss, in other words, the additional electrodes 726 make it possible to raise the upper limit value of the gap length G. Therefore, the preferred range of the gap length G based on FIG. 5 and FIG. 6 is the preferred range in the present embodiment as well. Further, in the present embodiment, it is possible to set a further broader range as the preferred range of the gap length G.

(Modification of Seventh Embodiment)

Figure 14C:
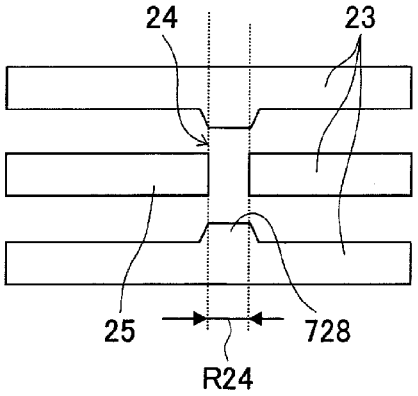

FIG. 14C is a partially enlarged plan view showing principal parts of a modification of the seventh embodiment.

In this modification, additional electrodes 728 project from the lateral sides of the electrode fingers 23. Also in this case, when viewed in the propagation direction of SAW, at least portions of the gaps 24 are closed, therefore the propagation loss is suppressed.

In this way, so long as the additional electrodes are located between the electrode fingers 23 and the dummy electrodes 25 which are adjacent to each other in the propagation direction of SAW and at positions which they close at least portions of the gaps 24 when viewed in the propagation direction of SAW and are connected to at least one of the electrode fingers 23 or dummy electrodes 25, their shapes etc. may be suitably set.

<Eighth Embodiment>

Figure 15:
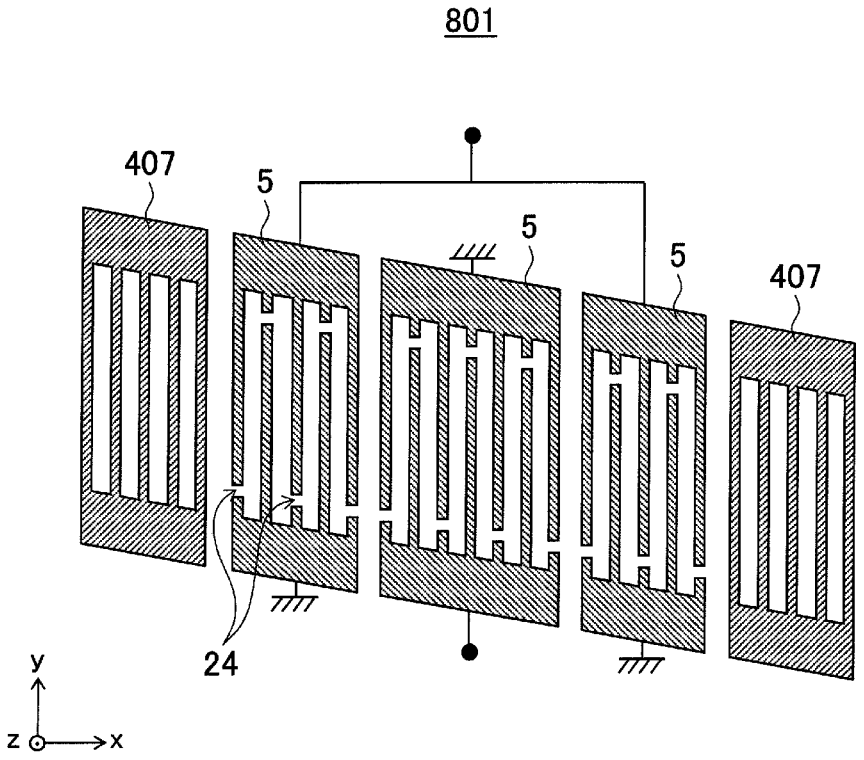
FIG. 15A plan view which shows principal parts of a SAW element according to an eighth embodiment.

FIG. 15 is a plan view showing principal parts of a SAW element 801 according to an eighth embodiment.

In the SAW element 801, a plurality of IDT electrodes 5 are arranged in a direction inclined to the side the same as the side to which the array of the plurality of gaps 24 is inclined relative to the propagation direction of the SAW. Preferably, the angles θ of the gaps 24 of the plurality of IDT electrodes 5 are the same as each other, and the plurality of IDT electrodes 5 are arranged with an inclination relative to the propagation direction by that angle θ. Further preferably, among the plurality of IDT electrodes 5, the intersection widths are the same as each other. Further, the plurality of IDT electrodes 5 and reflectors 7 configure a so-called double mode type SAW filter.

In such a double mode type SAW filter as well, by the arrangement of the plurality of gaps 24 in the direction inclined relative to the propagation direction, occurrence of the transverse mode spurious wave is suppressed.

<Setting of Number of Electrode Fingers of Reflectors>

The above-explained embodiments proposed configurations in which the intersection range of the plurality of electrode fingers 23 obliquely extended relative to the propagation direction of the SAW by paying attention to the spurious wave near the resonance point and anti-resonance point. In the following description, a method of improvement is explained paying attention to a spurious wave at a position further to a higher frequency side than the resonance point and anti-resonance point.

Figure 16A:
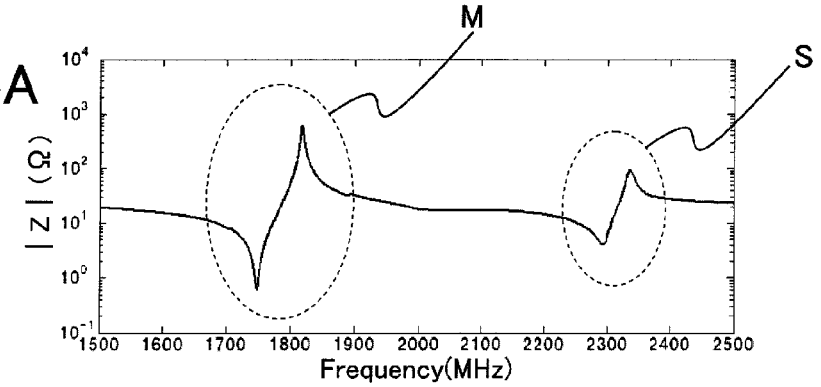
FIG. 16A to FIG. 16C are views for explaining a method of setting electrode fingers in reflectors.
Figure 16B:
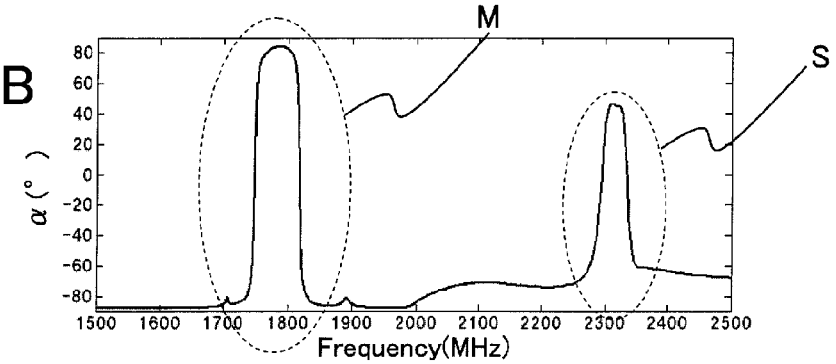

FIG. 16A and FIG. 16B are diagrams the same as FIG. 4C and FIG. 4D, which show impedance characteristics in a SAW element provided with a protective layer 11 thicker than the IDT electrodes (5 etc.) and reflectors (7 etc.) as in the examples and comparative example. Note, in FIG. 16A and FIG. 16B, the ranges of abscissas are made broader than those in FIG. 4C and FIG. 4D.

Region M are region (region of primary resonance) in which the appearance of resonance point and anti-resonance point is intended. On the other hand, the region S are region (region of spurious wave) in which resonance point and anti-resonance point which were not intended appeared. The spurious wave occurred at a frequency further to a higher frequency side relative to the frequency of the primary resonance.

When such a spurious wave occurs, various inconveniences occur. For example, in a case where the SAW element is utilized for filtering signals for wireless communication in a mobile phone, the communication frequency of the wireless LAN ends up coinciding with the frequency of the spurious wave, therefore wireless communication of a mobile phone is liable to be obstructed.

Note that, the possibility of occurrence of such a spurious wave is high at the time when a protective layer 11 thicker than the IDT electrodes and reflectors is provided, while the possibility of occurrence is extremely low in a case where a protective layer 11 is not provided.

The present inventor engaged in in-depth studies and as a result discovered that such a spurious wave could be suppressed by suitably setting the number of electrode fingers (29) in the reflectors (7 etc.). Specifically, this is as follows.

A plurality of SAW elements having different numbers of electrode fingers of reflectors were experimentally manufactured and measured for their impedance characteristics. The conditions of the SAW elements were as follows. Note that, in the following description, for reference, notations in the first embodiment etc. are attached.

Substrate 3: 0° YX—$LiNO_3$ substrate
Conductive layer 15 (IDT electrode/reflector):
  Material: Al—Cu alloy
  Note, there is an underlying layer made of Ti of 6 nm between the substrate 3 and the conductive layer 15.
  Thickness "e" (Al—Cu alloy layer): 149 nm
Added films 9:
  Material: $Ta_2O_5$
  Thickness "t": 91 nm
Protective layer 11:
  Material: $SiO_2$
  Thickness T: 760 nm
Electrode fingers of IDT electrode:
  Pitch "p": 1.01 μm
  Duty (wl/p): 0.5
  Number: 300
Dummy electrode length: 4.4 μm
Number "n" of electrode fingers in reflector: 2, 4, 6, 8, 10, 12, 14, 16, 18 or 20
Note that, the number "n" of electrode fingers in the reflectors is the number in one reflector. The SAW element has reflectors on the two sides of the propagation direction of SAW, so has 2n electrode fingers in total.

Figure 16C:
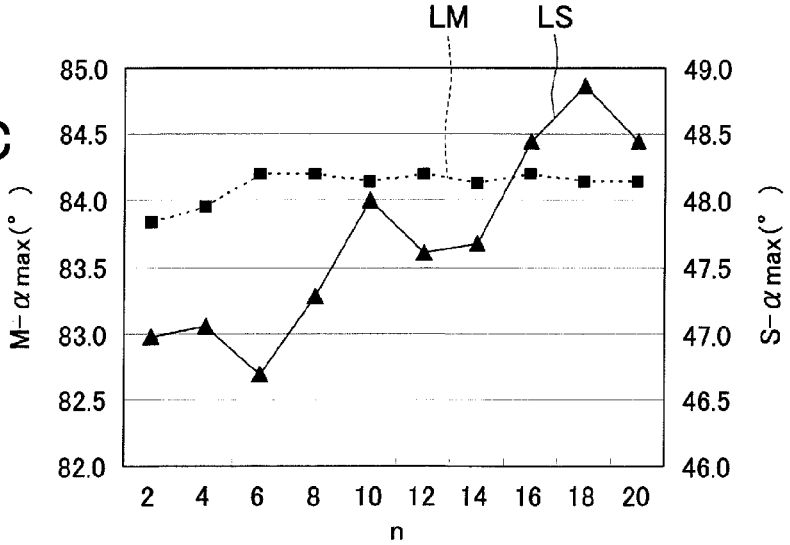

FIG. 16C is a diagram showing the measurement results. The abscissa shows the number "n" of the electrode fingers of the reflectors, while the ordinate shows the maximum phase max (see FIG. 4D). The scale of the ordinate on the left side on the drawing shows the value of the maximum phase max of the primary resonance (region M), while the scale of the ordinate on the right side on the drawing shows the value of the maximum phase max of the spurious wave (region S). A solid line LS shows the measurement results of the maximum phase max of the spurious wave, while a dotted line LM shows the measurement results of the maximum phase max of the primary resonance. Note that, the primary resonance means a resonance among resonances occurring in the SAW element at which the impedance of the resonance point has become the smallest.

The maximum phase αmax of the spurious wave roughly becomes smaller as the number of electrode fingers of the reflectors becomes smaller (the characteristics of the SAW element relating to the spurious wave are improved). On the other hand, the maximum phase αmax of the primary resonance does not change very much even when the number of electrode fingers of the reflectors becomes smaller. Note, when the number of electrode fingers of the reflectors becomes smaller than six, the maximum phase αmax of the primary resonance becomes smaller (the characteristics of the SAW element relating to the primary resonance fall).

It is seen from this result that preferably the number of electrode fingers of the reflectors are made as small as possible within such range that the maximum phase αmax of the primary resonance does not fall.

The present inventor examined the reasons why such a result occurred in the following way. In the SAW element, there is an acoustic wave I of a vibration mode generating the primary resonance and an acoustic wave II of a vibration mode generating a spurious wave. Further, the acoustic wave II has a lower reflectivity at the electrode fingers of the reflectors compared with the acoustic wave I. Accordingly, when the number of electrode fingers of the reflectors is six, the acoustic wave I is wholly reflected by the reflectors, but the acoustic wave II is not wholly reflected by the reflectors and is partially leaked to the outside of the reflectors. Further, when the number of electrode fingers is made larger than six, the acoustic wave I is wholly reflected by the reflectors in the same way as the case of six, therefore the maximum phase αmax does not change. On the other hand, for the acoustic wave II, the quantity of reflection becomes larger than that in the case of six, therefore the maximum phase αmax becomes larger.

When calculating the reflectivities F of the acoustic wave I and acoustic wave II with respect to one electrode finger according to the finite element method, the reflectivity was about 14% in the acoustic wave I and was less than 1% in the acoustic wave II. Further, it is seen from these computation results that the smallest number of electrode fingers for wholly reflecting the acoustic wave I is seven (≈100%/14%) which roughly coincides with the six of the experimental result. Accordingly, it is considered that this conclusion is roughly correct. Note that, the difference between the computed value of seven and the experimental value of six is one. The reason for this is considered to be the influence of the calculation accuracy, machining accuracy, etc.

From the above results of study, from the viewpoint of making the spurious wave small while securing a large maximum phase αmax of primary resonance, most preferably the number of electrode fingers of the reflectors is [{100(%)/(reflectivity Γ of acoustic wave I)(%)} (round off after the decimal point)±1]. Note that, in general, it is considered that preferably the number "n" of reflectors is as large as possible, for example, the number is 30 to 40 in the one port resonator as shown in FIGS. 1 and 50 to 100 in a vertically coupled double mode type SAW filter.

It is considered that the effect of setting the number of electrode fingers of the reflectors as described above is exerted not only in a SAW element having the intersection range obliquely formed as in the embodiments, but also in a SAW element having a square intersection range parallel to the propagation direction of SAW and in a SAW element which is apodized as exemplified in FIG. 7.

The present invention is not limited to the above embodiments and may be executed in various ways.

The above embodiments may be suitably combined. For example, the additional electrodes in the seventh embodiment may be provided not only in the first embodiment, but also in the second to sixth and eighth embodiments. Further, for example, the IDT electrodes configuring the double mode type SAW filter in the eighth embodiment are not limited to the IDT electrodes in the first embodiment and may be the IDT electrodes in the second or third embodiment (FIG. 8, FIG. 9). Further, for example, the reflectors of the double mode type SAW filter in the eighth embodiment may be the reflectors in the first embodiment as well. Further, for example, a plurality of IDT electrodes arranged in the direction perpendicular to the propagation direction of the acoustic wave as in the fifth embodiment (FIG. 11) may be two or more double mode type SAW filters cascade-connected or may be a double mode type SAW filter and a resonator connected to its input side.

The acoustic wave element is not limited to a SAW element (in a narrow sense). For example, it may be a so-called elastic boundary wave element (note, included in the SAW element in a broad sense) in which the thickness of the protective layer (11) is relatively large (for example 0.5λ to 2λ) as well. Note that, in the elastic boundary wave element, the formation of the vibration space (33a) is unnecessary, and accordingly the cover 33 etc. are unnecessary too.

The acoustic wave element is not limited to a wafer level packaged one. For example, in the SAW element, the cover 33 and terminal 35 etc. need not be provided, and the pad 39 on the upper surface 3a of the substrate 3 and the mount-use pad 55 of the circuit board 53 may be directly bonded by solder 57 as well. And then, the vibration space may be formed by a clearance between the SAW element 1 (protective layer 11) and the mount surface 53a of the circuit board 53. Further, the wafer level packaged acoustic wave element may be given a variety of configurations such as a configuration in which a terminal is not provided, and the pad 39 abuts against a solder ball arranged on the mount-use pad 55.

The plurality of gaps may differ in size from each other. Further, the inclination angles θ of the line directions of the adjacent two gaps relative to the propagation direction need not be the same as each other. That is, the plurality of gaps may be arranged a bit zigzagged as well. Further, the angles need not be the same as each other between the first gap and the second gap either.

In the acoustic wave element, the protective layer 11 and the added films 9 are not essential factors. Further, the protective layer may be provided for only the purpose of preventing corrosion and may be made thinner than the thickness of the electrode fingers.

The material of the electrodes (electrode fingers) is not limited to Al and an alloy containing Al as the major component and may be for example Cu, Ag, Au, Pt, W, Ta, Mo, Ni, Co, Cr, Fe, Mn, Zn, or Ti. The material of the protective layer is not limited to $SiO_2$ and may be for example a silicon oxide other than $SiO_2$.

It is not necessary to arrange the added electrodes on the two sides of the propagation direction with respect to the gaps, but may be arranged on only one side. Further, the added electrodes projecting from the lateral sides of the dummy electrodes need not be connected to the electrode fingers either. The shapes of the added electrodes can be modified in various ways. For example, the added electrodes may be shaped so that the edge parts on the gap sides are recessed.

REFERENCE SIGNS LIST

1 . . . SAW element (acoustic wave element), 3 . . . substrate (piezoelectric substrate), 3a . . . upper surface,

5 . . . IDT electrode (electrode), 21 . . . bus bar, 23 . . . electrode finger, 25 . . . dummy electrode, and 27 . . . auxiliary electrode.

The invention claimed is:

1. An acoustic wave element, comprising:

a piezoelectric substrate; and an IDT electrode located on an upper surface of the piezoelectric substrate, wherein the IDT electrode comprises first bus bar and a second bus bar which face each other in a direction which intersects with a propagation direction of [the] *an* acoustic wave, a plurality of first electrode fingers which extend from the first bus bar to the second bus bar side, a plurality of second electrode fingers which extend from the second bus bar to the first bus bar side and have a portion adjacent to the plurality of first electrode fingers *in alternating fashion* in the propagation direction, a plurality of first dummy electrodes which extend from the first bus bar to the second bus bar side and have tips which face [the] tips of the plurality of second electrode fingers through a plurality of first gaps, and a plurality of second dummy electrodes which extend from the second bus bar to the first bus bar side and have tips which face [the] tips of the plurality of first electrode fingers through a plurality of second gaps, wherein, in a certain range of the propagation direction of the IDT electrode, when [the] *an* arrangement direction of [the] *a first group of* first gaps among the plurality of first gaps which are adjacent to each other is [the] *a* first direction, the first direction is inclined relative to the propagation direction, when [the] *an* arrangement direction of [the] *a first group of* second gaps among the plurality of second gaps which are adjacent to each other is [the] *a* second direction, the second direction is inclined [to the side the same as the side to which the first direction is inclined] relative to the propagation direction, and

[when the inclination angle of the first direction relative to the propagation direction is a first angle θA and the inclination angle of the second direction relative to the propagation direction is a second angle θB, the first angle θA and the second angle θB are within a following ranges:

$10° \leq \theta A \leq 26°$ $10° \leq \theta B \leq 26°$, and]

wherein, when [the] *a* wavelength of the acoustic wave is λ(μm), within the certain range, [the] *a* gap lengths G (μm) of the plurality of first gaps and the plurality of second gaps in the direction perpendicular to the propagation direction are within the following range: [$0.1 \leq G \leq 0.28\lambda$] *$0.1\ \mu m \leq G \leq 0.28\lambda$, and a direction of all of the plurality of first gaps and a direction of all of the plurality of second gaps being inclined in a same direction.*

2. The acoustic wave element according to claim 1, wherein

*when an inclination angle of the first direction relative to the propagation direction is a first angle θA and an inclination angle of the second direction relative to the propagation direction is a second angle θB,* the first angles θA are the same for all the adjacent first gaps, the second angles θB are the same for all the adjacent second gaps, and the first angles θA and the seconds angle θB are the same.

3. The acoustic wave element according to claim 1, wherein within the certain range,

[the] *an* edge part of the first bus bar which is on the second bus bar side is inclined relative to the propagation direction so as to become parallel relative to the arrangement direction of the first gaps, and

[the] *an* edge part of the second bus bar which is on the first bus bar side is inclined relative to the propagation direction so as to become parallel relative to the arrangement direction of the second gaps.

4. The acoustic wave element according to claim 1, wherein the certain range is the whole of the propagation direction of the IDT electrode.

5. The acoustic wave element according to claim 4, wherein [the] *a* first outer side edge part of the first bus bar which is on [the] *a* side opposite to the second bus bar is inclined relative to the propagation direction so as to become parallel to the arrangement direction of the first gaps,

[the] *a* second outer edge part of the second bus bar which is on [the] *a* side opposite to the first bus bar is inclined relative to the propagation direction so as to become parallel to the arrangement direction of the second gaps, and the plurality of IDT electrodes are arranged in the direction perpendicular to the propagation direction.

6. The acoustic wave element according to claim 1, further comprising a reflector which is adjacent to the IDT electrode in the propagation direction, wherein the reflector comprises a third bus bar on the first bus bar side and a fourth bus bar on the second bus bar side which face each other in the direction perpendicular to the propagation direction, and a plurality of third electrode fingers extending so as to connect the third bus bar and the fourth bus bar,

[the] *an* edge part of the third bus bar which is on the fourth bus bar side is inclined relative to the propagation direction so as to become parallel to the arrangement direction of the first gaps, and

[the] *an* edge part of the fourth bus bar which is on the third bus bar side is inclined relative to the propagation direction so as to become parallel to the arrangement direction of the second gaps.

7. The acoustic wave element according to claim 1, which is a double mode type SAW filter in which a plurality of the above IDT electrodes are arranged in a direction which is inclined relative to the propagation direction to [the] *a* side the same as [the] *a* side to which the arrays of the plurality of first gaps and the plurality of second gaps are inclined.

8. An acoustic wave device having an acoustic wave element according to claim 1 and a circuit board on which the acoustic wave element is mounted.

9. An acoustic wave element, comprising:

a piezoelectric substrate and an IDT electrode located on an upper surface of the piezoelectric substrate, wherein the IDT electrode comprises a first bus bar and a second bus bar which face each other in a direction intersecting with a propagation direction of the acoustic wave, a plurality of first electrode fingers which extend from the first bus bar to the second bus bar side, a plurality of second electrode fingers which extend from the second bus bar to the first bus bar side and have a portion adjacent to the plurality of first electrode fingers *in alternating fashion* in the propagation direction, a plurality of first dummy electrodes which extend from the first bus bar to the second bus bar side and have tips which face the tips of the plurality of second electrode fingers through a plurality of first gaps, a plurality of second dummy electrodes which extend from the second bus bar to the first bus bar side and have tips which face the tips of the plurality of first electrode fingers through a plurality of second gaps, a first additional electrode which is located between a first electrode finger and a first dummy electrode which are adjacent to each other and at a position which it closes at least a portion of a first gap when viewed in the propagation direction and is connected to at least one of the first electrode finger or the first dummy electrode, and a second additional electrode which is located between a second electrode finger and a second dummy electrode which are adjacent to each other and at a position which it closes at least a portion of the second gaps when viewed in the propagation direction and is connected to at least one of the second electrode finger or the second dummy electrode, and, in a certain range of the propagation direction of the IDT electrode, when [the] *an* arrangement direction of [the] *a first group of* first gaps among the plurality of first gaps which are adjacent to each other is a [third] *first* direction, the third direction is inclined relative to the propagation direction, when [the] *an* arrangement direction of [the] *a first group of* second gaps among the plurality of second gaps which are adjacent to each other is a [fourth] *second* direction, the [fourth] *second* direction is inclined to [the] *a* side the same as [the] *a* side to which the third direction is inclined relative to the propagation direction, and when [the] *an* inclination angle of the [third] *first* direction relative to the propagation direction is a [third] *first* angle [θC] θ*A* and [the] *an* inclination angle of the [fourth] *second* direction relative to the propagation direction is a [fourth] *second* angle [θD]θ*B*, the third angle [θC] θ*A* and the [fourth] *second* angle [θD] θ*B* are within a following ranges:

[6°≤θC≤26°] *6°≤θA≤26*

[6°≤θD≤26°] *6°≤θB≤26, and*

*a direction of all of the plurality of first gaps and a direction of all of the plurality of second gaps being inclined in a same direction.*

10. The acoustic wave element according to claim 9, wherein the [third angles θC are] *first angle θA is* the same for all the adjacent first gaps, the [fourth angles θD are] *second angle θB is* the same for all the adjacent second gaps, and the [third angles θC] *first angle θA* and the [fourth angles θD] *second angle θB* are the same.

11. An acoustic wave element comprising:

a piezoelectric substrate;

an IDT electrode located on an upper surface of the piezoelectric substrate, wherein the IDT electrode comprises a first bus bar and a second bus bar which face each other in a direction which intersects with a propagation direction of the acoustic wave, a plurality of first electrode fingers which extend from the first bus bar to the second bus bar side, a plurality of second electrode fingers which extend from the second bus bar to the first bus bar side and have a portion adjacent to the plurality of first electrode fingers in the propagation direction, a plurality of first dummy electrodes which extend from the first bus bar to the second bus bar side and have tips which face the tips of the plurality of second electrode fingers through a plurality of first gaps, and a plurality of second dummy electrodes which extend from the second bus bar to the first bus bar side and have tips which face the tips of the plurality of first electrode fingers through a plurality of second gaps;

a reflector which is adjacent to the IDT electrode in the propagation direction; and a protective layer which is located on the upper surface of the piezoelectric substrate so as to cover the IDT electrode and the reflector, and which has a larger thickness than those of the IDT electrode and the reflector, wherein, in a certain range of the propagation direction of the IDT electrode, when [the] *an* arrangement direction of [the] *a first group of* first gaps among the plurality of first gaps which are adjacent to each other is the first direction, the first direction is inclined relative to the propagation direction, when [the] *an* arrangement direction of [the] *a first group of* second gaps among the plurality of second gaps which are adjacent to each other is the second direction, the second direction is inclined [to the side the same as the side to which the first direction is inclined] relative to the propagation direction, and when [the] *an* inclination angle of the first direction relative to the propagation direction is a first angle θA and [the] *an* inclination angle of the second direction relative to the propagation direction is a second angle θB, the first angle θA and the second angle θB are within a following ranges:

10°≤θA≤26°

10°≤θB≤26°, wherein the reflector comprises a third bus bar on the first bus bar side and a fourth bus bar on the second bus bar side which face each other in the direction perpendicular to the propagation direction, and a plurality of third electrode fingers which extend so as to connect the third bus bar and the fourth bus bar, and wherein, when the reflectivity of the acoustic wave generating a primary resonance in the IDT electrode is Γ(%), the number of the third electrode fingers is within a following range: {100(%)/Γ(%)±1}.

*12. The acoustic wave element according to claim 1, wherein*

*when an inclination angle of the first direction relative to the propagation direction is a first angle θA and an inclination angle of the second direction relative to the propagation direction is a second angle θB, the first angle θA and the second angle θB are within a following ranges:*

*10°≤θA≤26*

*10°≤θB≤26.*

13. The acoustic wave element according to claim 1; wherein the piezoelectric substrate; and the first direction forms a first angle with respect to the first outer edge, and a perpendicular direction to the plurality of the first electrode fingers forms a second angle with respect to the outer edge, the first angle being equal to or smaller than a second angle.

14. An acoustic wave element, comprising:

a piezoelectric substrate having a first outer edge and a second outer edge; and an IDT electrode located on an upper surface of the piezoelectric substrate, wherein the IDT electrode comprises a first bus bar a plurality of first electrode fingers which extend from the first bus bar, a second bus bar, a plurality of second electrode fingers which extend from the second bus bar to the first bus bar side and have a portion adjacent to the plurality of first electrode fingers in alternating fashion in the propagation direction, a plurality of first dummy electrodes which extend from the first bus bar and face the second electrode fingers through a plurality of first gaps, and a plurality of second dummy electrodes which extend from the second bus bar and face the first electrode fingers through a plurality of second gaps, and wherein, when the wavelength of the acoustic wave is $\lambda(\mu m)$, within a certain range of the propagation direction of the IDT electrode, the gap lengths G ($\mu m$) of the plurality of first gaps and the plurality of second gaps in the direction perpendicular to the propagation direction are within the following range: $0.1\ \mu m \leq G \leq 0.28\lambda$, wherein a direction connecting tips of the plurality of first electrode fingers forms a first angle with respect to a perpendicular direction to the plurality of the first electrode fingers and a second angle with respect to the first outer edge, the second angle being equal to or smaller than the first angle, a direction of all the plurality of first gaps being oriented in a same direction, and a perpendicular direction to the plurality of first electrode fingers and the second outer edge are not orthogonal to each other.

15. The acoustic wave element according to claim 14, wherein the second angle is approximately 0°.

16. The acoustic wave element according to claim 14, wherein the piezoelectric substrate is formed by a lithium tantalite.

17. The acoustic wave element according to claim 14, wherein a direction connecting tips of the plurality of second electrode fingers forms a third angle with respect to a perpendicular direction to the plurality of the first electrode fingers, wherein the first angle is approximately equal to the third angle.

18. The acoustic wave element according to claim 14, wherein the IDT electrode is formed by a plurality of metallic layers, each of the plurality of metallic layers being laminated.

19. The acoustic wave element according to claim 14, comprising a plurality of the IDT electrodes, wherein the first bas bar electrode in one of the IDT electrodes is aligned in parallel with the second bas bar in another the IDT electrode adjacent to the one of the IDT electrodes.

20. The acoustic wave element according to claim 14, comprising a plurality of the IDT electrodes, which constitutes a ladder type filter.

21. The acoustic wave element according to claim 13, comprising a cover covering the IDT electrode side of the substrate, and a terminal passing through the cover.

22. The acoustic wave element according to claim 14, comprising a plurality of the IDT electrodes, and a line connecting each of neighboring IDT electrodes of the plurality of the IDT electrodes, wherein a direction of the line is inclined relevant to the plurality of first electrode fingers of each of the plurality of the IDT electrodes.

23. The acoustic wave element according to claim 14, wherein a gap between the first bus bar and the second bus bar in a direction of the plurality of the first electrode fingers is shorter than a length of the first bus bar or the second bus bar in a direction of the first outer edge.

24. An acoustic wave element, comprising:

a piezoelectric substrate having a rectangular shape having two outer edges, a first outer edge and a second outer edge; and an IDT electrode located on an upper surface of the piezoelectric substrate, wherein the IDT electrode comprises a first bus bar and a second bus bar which face each other in a direction which intersects with a propagation direction of the acoustic wave, a plurality of first electrode fingers which extend from the first bus bar to the second bus bar side, a plurality of second electrode fingers which extend from the second bus bar to the first bus bar side and have a portion adjacent to the plurality of first electrode fingers in alternating fashion in the propagation direction, a plurality of first dummy electrodes which extend from the first bus bar to the second bus bar side and have tips which face the tips of the plurality of second electrode fingers through a plurality of first gaps, and a plurality of second dummy electrodes which extend from the second bus bar to the first bus bar side and have tips which face the tips of the plurality of first electrode fingers through a plurality of second gaps, wherein, an area where the plurality of first electrode fingers and the plurality of second electrode fingers are crossing each other shapes a parallelogram, wherein, when the wavelength of the acoustic wave is $\lambda(\mu m)$, within the certain range, the gap lengths G ($\mu m$) of the plurality of first gaps and the plurality of second gaps in the direction perpendicular to the propagation direction are within the following range: $0.1\ \mu m \leq G \leq 0.28\lambda$ wherein the plurality of first electrode fingers and the plurality of second electrode fingers are inclined rela-

*tive to the two outer edges, a direction of all the plurality of first gaps being oriented in a same direction, and a perpendicular direction to the plurality of first electrode fingers and the second outer edge are not orthogonal to each other.*

* * * * *